United States Patent
Ota et al.

(10) Patent No.: US 11,068,330 B2
(45) Date of Patent: Jul. 20, 2021

(54) SEMICONDUCTOR DEVICE AND ANALYSIS SYSTEM

(71) Applicant: RENESAS ELECTRONICS CORPORATION, Tokyo (JP)

(72) Inventors: Naoya Ota, Tokyo (JP); Kan Takeuchi, Tokyo (JP); Fumio Tsuchiya, Tokyo (JP); Masaki Shimada, Tokyo (JP); Shinya Konishi, Tokyo (JP); Daisuke Oshida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 42 days.

(21) Appl. No.: 16/543,129

(22) Filed: Aug. 16, 2019

(65) Prior Publication Data
US 2020/0081757 A1 Mar. 12, 2020

(30) Foreign Application Priority Data
Sep. 7, 2018 (JP) .............................. JP2018-167794

(51) Int. Cl.
*G06F 11/07* (2006.01)
*H03K 3/03* (2006.01)

(52) U.S. Cl.
CPC ........ *G06F 11/079* (2013.01); *G06F 11/0727* (2013.01); *G06F 11/0751* (2013.01); *H03K 3/0315* (2013.01)

(58) Field of Classification Search
CPC .............. G06F 11/079; G06F 11/0727; G06F 11/0751; G06F 11/1004; H03K 3/0315
See application file for complete search history.

(56) References Cited

U.S. PATENT DOCUMENTS

| | | | | |
|---|---|---|---|---|
| 6,414,508 | B1* | 7/2002 | London | G01R 31/3161 324/762.05 |
| 10,361,685 | B2* | 7/2019 | Takeuchi | H03K 5/159 |
| 2017/0187358 | A1 | 6/2017 | Takeuchi et al. | |
| 2019/0219628 | A1* | 7/2019 | Kato | G01R 31/2607 |

FOREIGN PATENT DOCUMENTS

| | | |
|---|---|---|
| JP | 2013-092405 A | 5/2013 |
| JP | 2017-118414 A | 6/2017 |

OTHER PUBLICATIONS

Kan Takeuchi et. al., "Wear-out stress monitor utilizing temperature and voltage sensitive ring oscillators", IET Circuits, Devices & Systems, 2018, vol. 12, Iss. 2, pp. 182-188.

* cited by examiner

*Primary Examiner* — Nadeem Iqbal
(74) *Attorney, Agent, or Firm* — McDermott Will & Emery LLP

(57) ABSTRACT

The semiconductor device has a module having a predetermined function, an error information acquisition circuit for acquiring error information about an error occurring in the module, a stress acquisition circuit for acquiring a stress accumulated value as an accumulated value of stress applied to the semiconductor device, and an analysis data storage for storing analysis data as data for analyzing the state of the semiconductor device, the error information and the stress accumulated value at the time of occurrence of the error being associated with each other.

10 Claims, 23 Drawing Sheets

SEMICONDUCTOR DEVICE AND ANALYSIS SYSTEM

CROSS-REFERENCE TO RELATED APPLICATIONS

The disclosure of Japanese Patent Application No. 2018-167794 filed on Sep. 7, 2018 including the specification, drawings and abstract is incorporated herein by reference in its entirety.

BACKGROUND

The present invention relates to a semiconductor device and an analysis system, and, for example, to a technique for error analysis.

Techniques for analyzing device degradation are known. For example, Patent Document 1 discloses a technique for analyzing the lifetime of a device based on the stress applied to the device. This technique uses Arrhenius law or Eyring model to calculate lifetime. Patent Document 2 and Non-Patent Document 1 disclose a technique of measuring stress using a ring oscillator.

PRIOR-ART DOCUMENTS

Patent Documents

[Patent Document 1] Japanese Unexamined Publication Laid-Open No. 2013-92405
[Patent Document 2] Japanese Unexamined Publication Laid-Open No. 2017-118414

Non-Patent Literature

[Non-Patent Document 1] Kan Takeuchi et. al., "Wear-out stress monitor utilizing temperature and voltage sensitive ring oscillators", IET Circuits, Devices & Systems, 2018, Vol. 12, Iss. 2, pp. 182-188

SUMMARY

However, when the analysis of the failure of the device is performed focusing on the cumulative stress, the type of the error finally leading to the failure is not limited to one, and therefore, there is a possibility that a sufficiently useful analysis result cannot be obtained. Further, in a device requiring high reliability, a means called a functional safety mechanism is provided so that the error generated in the device does not occur as a failure of the device. Therefore, it is required to obtain data which can be analyzed more effectively for the predictive maintenance of the failure of the device.

Other objects and novel features will become apparent from the description of this specification and the accompanying drawings.

According to one embodiment, the semiconductor device has an analysis data storage unit that stores analysis data, which is data associating error information with a stress accumulated value at the time of occurrence of an error, as data for analyzing the state of the semiconductor device.

According to the above-mentioned embodiment, it is possible to obtain data enabling more useful analysis for predictive maintenance of a failure of a device.

DETAILED DESCRIPTION

Figure 1:
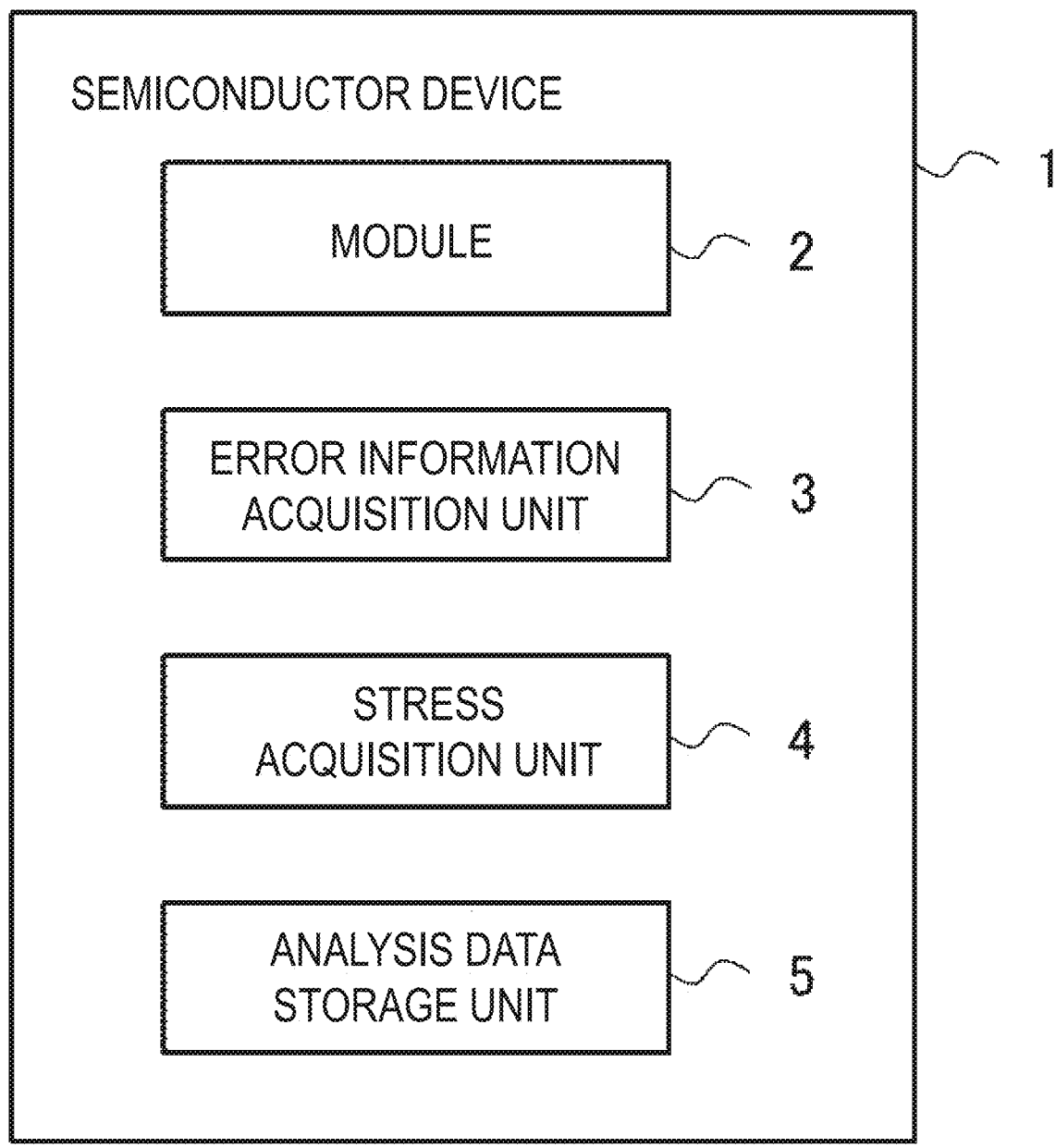
FIG. 1 is a block diagram illustrating an example of a configuration of a semiconductor device.

For clarity of explanation, the following description and drawings are appropriately omitted and simplified. In the drawings, the same elements are denoted by the same reference numerals, and a repetitive description thereof is omitted as necessary.

First, prior to the detailed description of the embodiment, the outline of the embodiment will be described. FIG. 1 is a block diagram showing an example of a configuration of a semiconductor device 1 according to an outline of the embodiment. The semiconductor device 1 includes a module 2, an error information acquisition unit 3, a stress acquisition unit 4, and an analysis data storage unit 5. The semiconductor device 1 is, for example, an MCU (Micro Control Unit), but is not limited thereto.

The module 2 provides a predetermined function. Module 2 is, for example, a hardware circuit that executes processing to provide a predetermined function, but may be software, not limited to hardware circuitry. The semiconductor device 1 may include a plurality of modules 2. The error information acquisition unit 3 acquires error information about an error that has occurred in the module 2. The stress acquisition unit 4 acquires a stress cumulative value which is a cumulative value of stress applied to the semiconductor device 1.

The analysis data storage unit 5 stores, as data for analyzing the state of the semiconductor device 1, analysis data which is data associating the error information acquired by the error information acquisition unit 3 with the stress accumulated value acquired by the stress acquisition unit 4 at the time of occurrence of the error. The analysis data storage unit 5 may store the analysis data in a memory (for example, a nonvolatile memory) provided in the semiconductor device 1 or may store the analysis data in another device (for example, a server that performs predetermined analysis processing using the analysis data).

As described above, the semiconductor device 1 does not store only the information on the stress as the analysis data, but stores data associating the error information with the stress cumulative value at the time of occurrence of the error as the analysis data. Therefore, according to such analysis data, it is possible to perform analysis focusing on the relationship between the error and the stress. As described above, according to the semiconductor device 1, it is possible to obtain data that enables more useful analysis for predicting and maintaining the failure of the device.

First Embodiment

Figure 2:
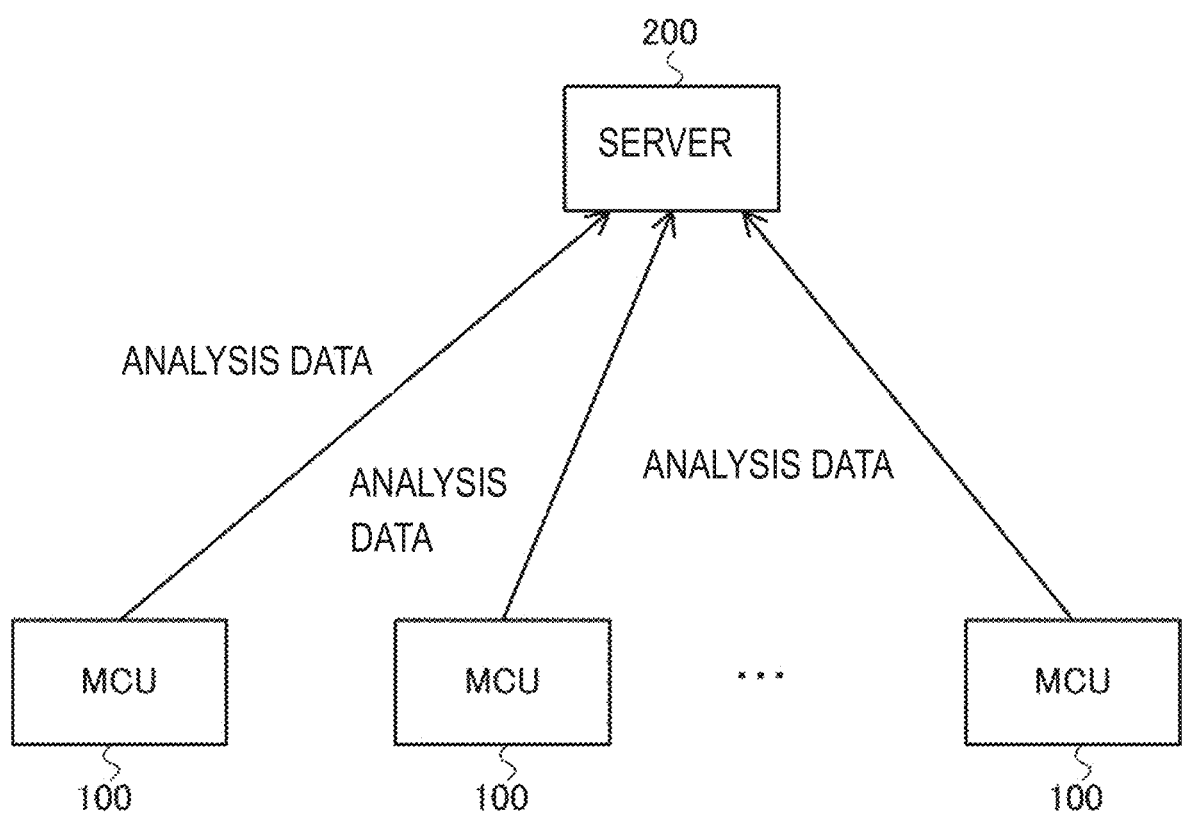
FIG. 2 is a block diagram illustrating an example of a configuration of an analysis system.

Details of the embodiment will be described below. FIG. 2 is a block diagram showing an example of the configuration of the analysis system 10 according to the first embodiment. The analysis system 10 includes M pieces of MCUs 100 (M is an integer equal to or greater than 1) and a server 200. The MCU 100 is, for example, an MCU mounted on a vehicle, but is not limited to the MCU. The server 200 is, for example, a server existing on a cloud, but is not limited thereto. The MCU 100 is communicatively connected to the server 200 by, for example, a wireless communication.

Figure 3:
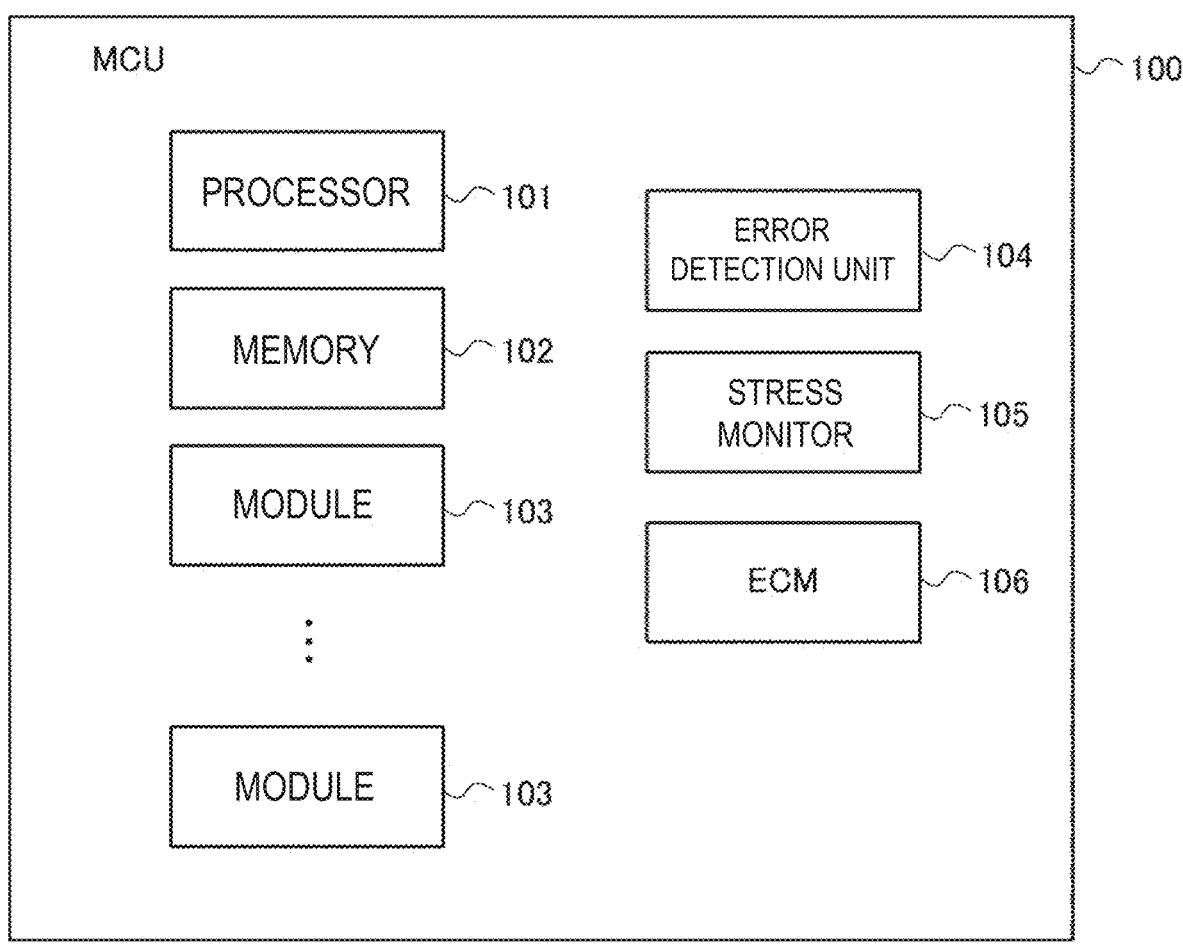
FIG. 3 is a block diagram illustrating an example of a configuration of an MCU.

FIG. 3 is a block diagram showing an exemplary configuration of the MCU 100 according to an embodiment of the present invention. As shown in FIG. 3, the MCU 100 includes a processor 101, a memory 102, modules 103, an error detection unit 104, a stress monitor 105, and an ECM (Error Control Module) 106. Here, the MCU 100 corresponds to the semiconductor device 1 of FIG. 1, and the processor 101, the memory 102, and the module 103 correspond to the module 2 of FIG. 1.

The memory 102 may be, for example, a volatile memory, a non-volatile memory, or both. The memory 102 is used to store software, such as a computer program, including one or more instructions to be executed by the processor 101. The memory 102 can store, not limited to software, various data. Also, the programs described above may be stored and provided to a computer using various types of non-transitory computer readable media. Non-transitory computer readable media includes various types of tangible storage media. Examples of non-transitory computer-readable media include magnetic recording media (e.g., flexible disks, magnetic tapes, hard disk drives), magneto-optical recording media (e.g., magneto-optical disks), CD-ROM (Read Only Memory, a CD-R, a CD-R/W, solid-state memories (e.g., masked ROM, PROM (Programmable ROM), EPROM (Erasable PROM, flash ROM, RAM (Random Access Memory)). The program may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

The processor 101 reads and executes software (computer program) from the memory 102, thereby performing various processes including processes of an error information acquisition unit 150, a stress acquisition unit 151, a cumulative operation time acquisition unit 152, and an analysis data storage unit 153, which will be described later. The processor 101 is, for example, a CPU (Central Processing Unit), but may be a GPU (Graphics Processing Unit) or the like. The processor 101 may include a plurality of processors.

The module 103 is a peripheral module configured by a hardware circuit that provides a predetermined function. For example, the modules 103 may be ADCs (Analog-To-Digital Converter), DACs (Digital-To-Analog Converter), timers, etc.

The error detection unit 104 detects an abnormality of a component corresponding to the module 2 shown in FIG. 1. That is, the error detection unit 104 detects an abnormality in the processor 101, the memory 102, and the module 103. The error detection unit 104 may exist for each component corresponding to the module 2, or may exist for a plurality of components corresponding to the module 2. The error detection unit 104 is configured by, for example, a hardware circuit, but may be implemented by software. The error detection unit 104 is, for example, an ECC (Error Checking and Correction) circuit for detecting an error in the memory 102, an error detection function of a DCLS (Dual Core Lock Step) circuit for detecting an error in the processor 101, or the like. The error detection unit 104 may detect an error generated in a module outside the semiconductor device by detecting an abnormal condition of the module controlled by the semiconductor device (MCU 100). When detecting an error, the error detection unit 104 outputs a signal indicating that the error has been detected to the ECM 106. The error detection unit 104 may output signals indicating error content such as a type of the detected error to the ECM 106.

In the present embodiment, the error detected by the error detection unit 104 includes an error that does not lead to a failure of the semiconductor device. That is, it includes errors that can be dealt with by the functional safety mechanisms of the MCU 100 or the like. For example, a 1-bit error in a memory is a correctable error because it can be corrected by an ECC circuit.

The ECM 106 is a controller that performs predetermined control based on signals notified from the error detection unit 104. For example, the ECM 106 is a hardware circuit having a register that stores setting information defining the control content for each type of error, and the hardware circuit refers to the setting information stored in the register corresponding to the signals notified from the error detection unit 104 to execute control according to the setting information. For example, upon receiving a notification from the error detection unit 104, the ECM 106 may generate an interrupt for causing the processor 101 to execute predetermined programs, may reset the MCU 100, or may notify another device or another component in the MCU 100 of the error.

The stress monitor 105 continuously measures the stress applied to the MCU 100 during the operation of the MCU 100, and holds a stress cumulative value which is a cumulative value of the measured stress. The stress monitor 105 is configured by software, for example. In this case, for example, the processor 101 executes a stress calculation program by inputting values measured by a temperature sensor or a voltage sensor included in the MCU 100, and thereby the stress is measured. That is, the stress monitor 105 may calculate the stress using the temperature of the MCU 100 measured by the temperature sensor and the Arrhenius model, or may calculate the stress using the power supply voltage of the MCU 100 measured by the voltage sensor and the Eyring model. The stress monitor 105 may be configured by a hardware circuit. In this case, for example, the stress monitor 105 includes a ring oscillator and a counter circuit having a predetermined dependence on the stress, and measures the stress by counting the oscillation frequency of the ring oscillator by the counter circuit.

In addition, the stress monitor 105 measures and holds an accumulated operation time, which is an accumulated value of the operation time of the MCU 100. In this manner, the stress monitor 105 holds the accumulated stress value and the accumulated operation time at a certain point in time of the MCU 100. In the following description, the accumulated stress value and the accumulated operation time are collectively referred to as stress data.

Figure 4:
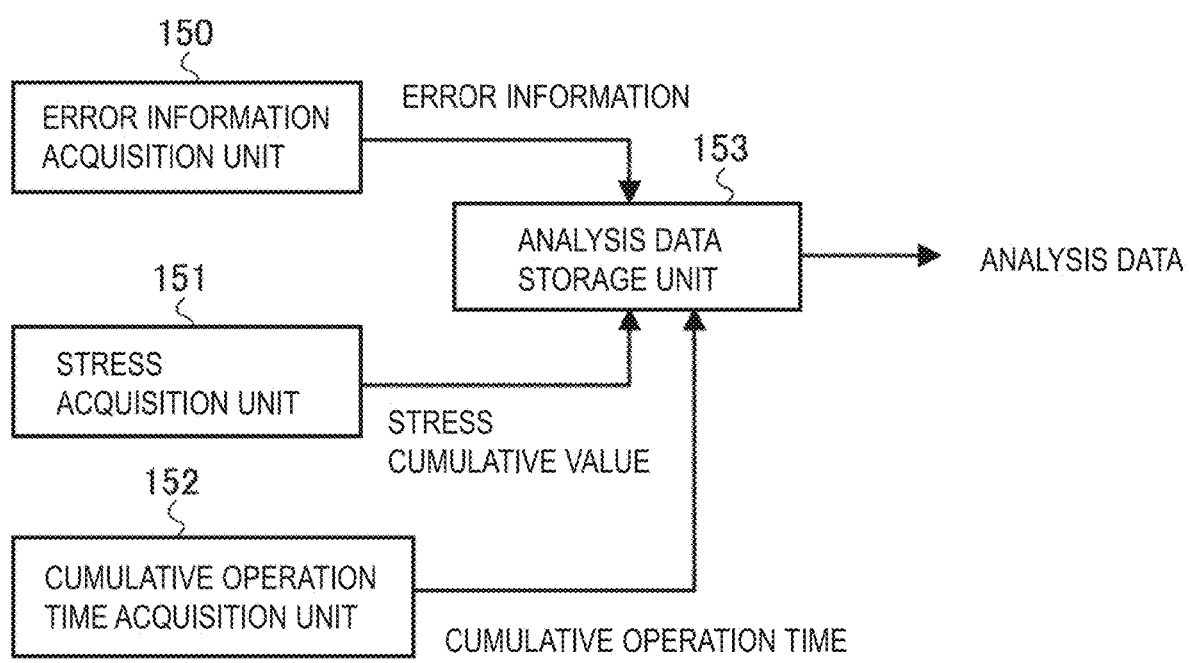
FIG. 4 is a block diagram illustrating an example of a further configuration of the MCU.

FIG. 4 is a block diagram illustrating an exemplary configuration of the MCU 100. The configuration shown in FIG. 4 is realized, for example, by causing the processor 101 to execute programs for interrupt handling generated by control of the ECM 106.

The error information acquisition unit 150 corresponds to the error information acquisition unit 3 of FIG. 1, and in the present embodiment, acquires error information about an error detected by the error detection unit 104. The error information includes information indicating the type of error. The information indicating the type of error includes information indicating which component has outputted the error. The information indicating the type of the error may include information indicating the content of the error. The error information may be generated by the error detection unit 104, or the error information may be generated by the ECM 106 based on signals notified from the error detection unit 104.

The stress acquisition unit 151 corresponds to the stress acquisition unit 4 in FIG. 1, and in the present embodiment, acquires a stress cumulative value held by the stress monitor 105. The cumulative operation time acquisition unit 152 acquires the cumulative operation time. In the present embodiment, the cumulative operation time acquisition unit 152 acquires the cumulative operation time held by the stress monitor 105. In this manner, the stress acquisition unit 151 and the cumulative operation time acquisition unit 152 function as a stress data acquisition unit that acquires stress data.

The analysis data storage unit 153 corresponds to the analysis data storage unit 5 of FIG. 1, generates analysis data, which is data associating the error information with the stress data at the time when the error indicated by the error information occurs, as data for analyzing the status of the MCU 100, and stores the generated data in the server 200. That is, the analysis data storage unit 153 stores, as analysis data, data in which the error information, the stress cumulative value at the time when the error indicated by the error information occurs, and the cumulative operation time at the time when the error occurs are associated with each other. It should be noted that the data associated therewith may be referred to as error time point data. The analysis data storage unit 153 stores the analysis data in the storage 202 (see FIG. 5) of the server 200 by transmitting the analysis data to the server 200 using, for example, a transmission/reception circuit (not shown) provided in the MCU 100.

As described above, in the present embodiment, the detected error includes an error that does not lead to a failure of the MCU 100 due to the functional safety mechanism. Therefore, the error information acquired by the error information acquisition unit 150 includes information on an error that does not occur as a failure of the semiconductor device by the function safety mechanism. Therefore, the analysis data storage unit 153 stores not only the stress data associated with the error information about the error that occurs as the failure of the semiconductor device, but also the stress data associated with the error information about the error that does not occur as the failure as the analysis data. Therefore, more analysis data can be acquired as compared with the case where only the analysis data for the error that occurs as the failure is stored. More data for the analysis process can be secured.

The analysis data storage unit 153 stores the stress data as analysis data in the storage 202 of the server 200 at a predetermined storage timing regardless of whether the error detection unit 104 has detected an error or not. In the present embodiment, the storage timing is at the time of shutdown, i.e., at the time of normal termination, but may be at a periodic timing during operation.

The analysis data storage unit 153 may store the analysis data in the memory 102 of the MCU 100 or the like in addition to storing the analysis data in the storage 202 of the server 200.

Figure 5:
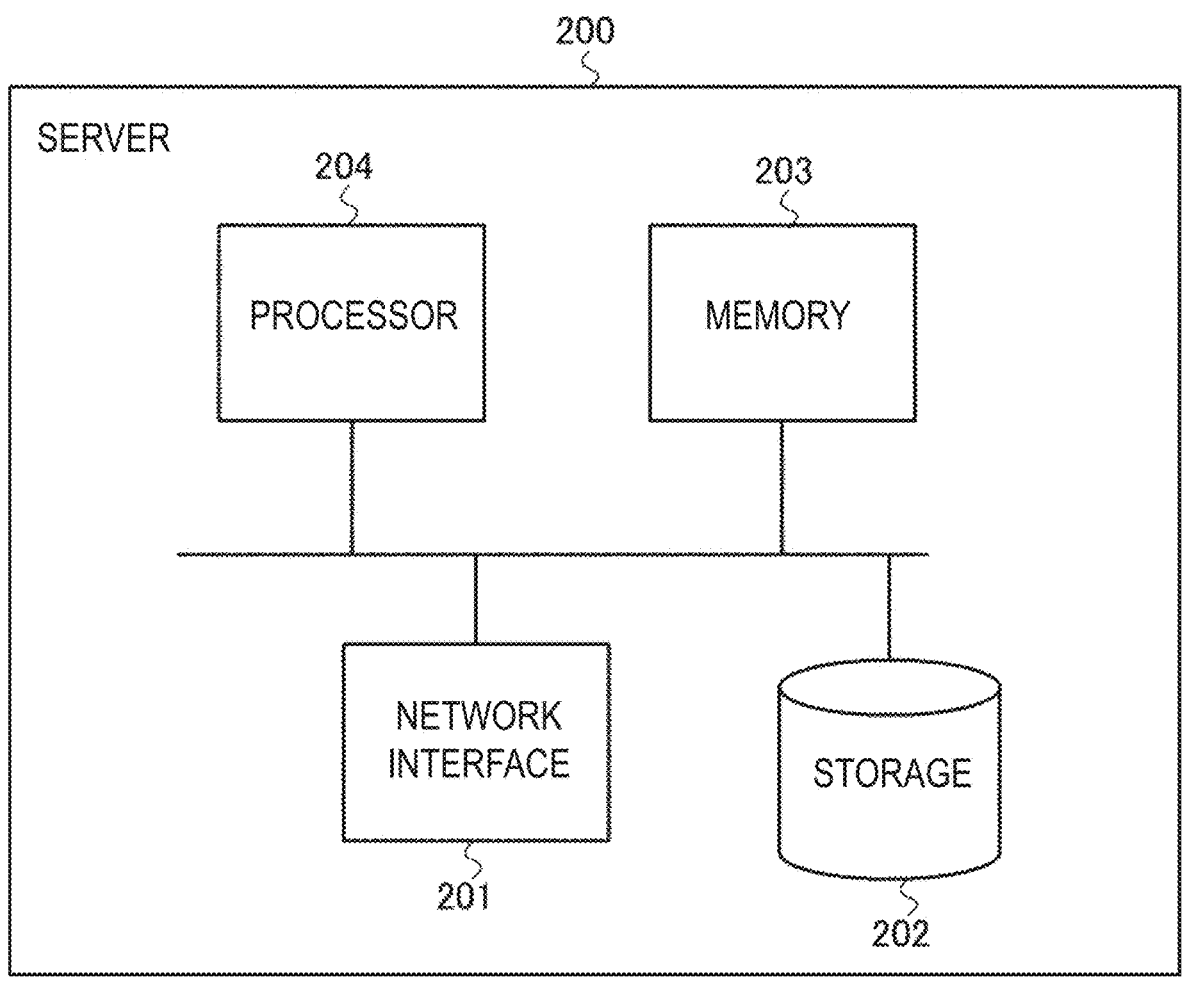
FIG. 5 is a block diagram illustrating an example of a hardware configuration of a server.

Next, the server 200 will be described. FIG. 5 is a block diagram showing an example of the hardware configuration of the server 200. As shown in FIG. 5, the server 200 includes, for example, a network interface 201, a storage 202, a memory 203, and a processor 204.

The network interface 201 is used to communicate with the MCU 100. The network interface 201 may include, for example, a network interface card (NIC).

The storage 202 includes an HDD (Hard Disk Drive), a magnetic tape, an optical disk, an SSD (Solid State Drive), or the like. The storage 202 stores various pieces of information including analysis data transmitted from the M pieces of MCU 100. The storage 202 may store a learned model generated by machine learning using analysis data.

The memory 203 is composed of, for example, a volatile memory or a nonvolatile memory. The memory 203 is used for storing, for example, a program including one or more instructions to be executed by the processor 204.

The processor 204 is, for example, a CPU, but may also be a GPU or the like. The processor 204 may include a plurality of processors. The processor 204 reads and executes a computer program from the memory 203, thereby performing processing of each component of the server 200 shown in FIG. 6.

The programs described above may be stored and provided to a computer using various types of non-transitory computer readable media. The program may also be supplied to the computer by various types of transitory computer-readable media.

Figure 6:
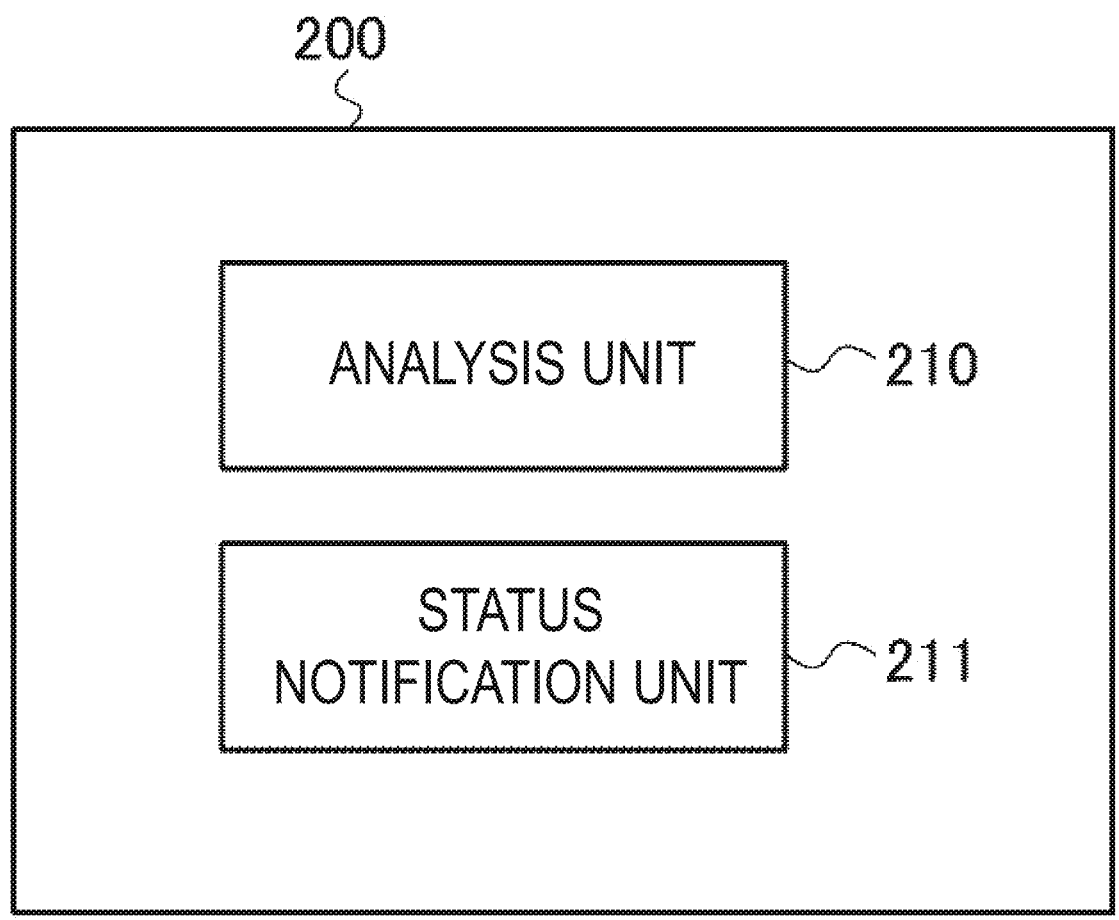
FIG. 6 is a block diagram illustrating an example of a functional configuration of the server.

FIG. 6 is a block diagram showing an example of the functional configuration of the server 200. As shown in FIG. 6, the server 200 includes an analysis unit 210 and a status notification unit 211.

The analysis unit 210 analyzes the status of the MCU 100 based on the analysis data stored in the storage 202. The analysis unit 210 analyzes the relationship between the information about the error (e.g., the location of occurrence of the error, the content of the error, the frequency of occurrence of the error, the interval of occurrence of the error, and the like) and the stress data. The analysis unit 210 may perform an analysis process involving machine-learning using the data for analysis and the AI (Artificial Intelligence) technique. That is, the analysis unit 210 may generate a model by machine learning using the analysis data as training data. The machine learning includes, but is not limited to, a neural network.

The status notification unit 211 notifies the MCU 100 of the status (diagnostic result) of the MCU 100 determined based on the analysis process by the analysis unit 210 using the network interface 201.

Figure 7:
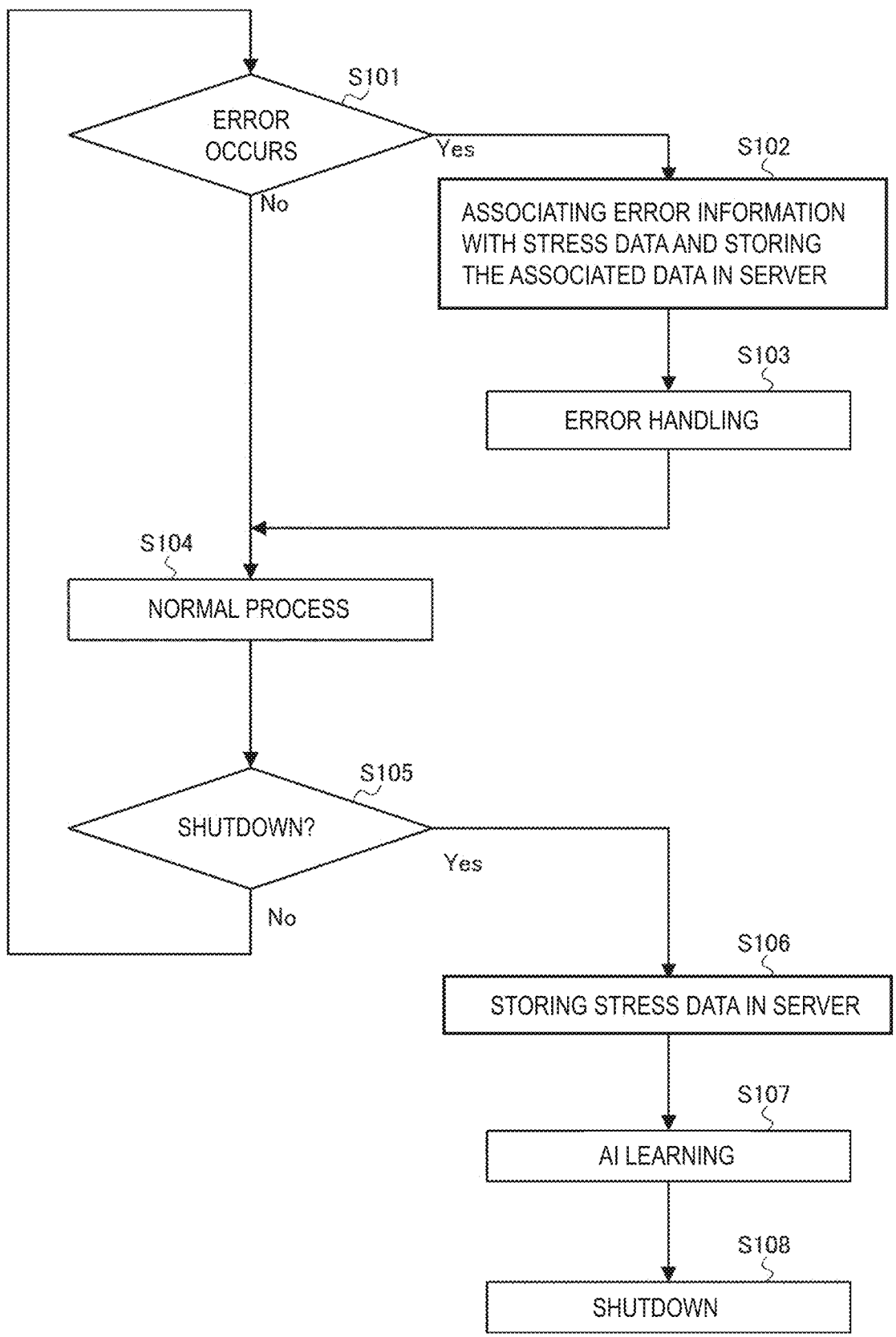
FIG. 7 is a flow chart illustrating an example of the operation of storing analysis data in the MCU.

FIG. 7 is a flow chart showing an exemplary operation for storing analysis data in the MCU 100. Hereinafter, the flow of the operation for storing the analysis data will be described with reference to FIG. 7. In step S101, the error detection unit 104 monitors whether an error has occurred or not. If the error detection unit 104 does not detect an error (NO in step S101), the MCU 100 performs a normal process in step S104. On the other hand, when the error detection unit 104 detects an error in any of the components (YES in step S101), the process proceeds to step S102.

In step S102, the analysis data storage unit 153 generates analysis data, which is data associating the error information about the error detected by the error detection unit 104 with the stress data at the time of occurrence of the error indicated by the error information, and stores the generated analysis data in the server 200. During the operation of the MCU 100, the stress monitor 105 continues to count the stress data. Thereafter, in step S103, predetermined processing (error processing) corresponding to an error such as a reset or the like is performed based on the control of the ECM 106. After step S103, the MCU 100 proceeds to the normal process, step S104.

The flow described above is repeated until an instruction to shut down the MCU 100 is received. When the MCU 100 receives the shutdown instruction (Yes in step S105), in step S106, the analysis data storage unit 153 stores the present stress data in the server 200. Next, in step S107, the MCU 100 instructs the server 200 to perform analysis using the analysis data stored in step S103 and step S106 (e.g., machine-learning using the analysis data and the AI technique). Thereafter, in step S108, the MCU 100 shuts down.

Figure 8:
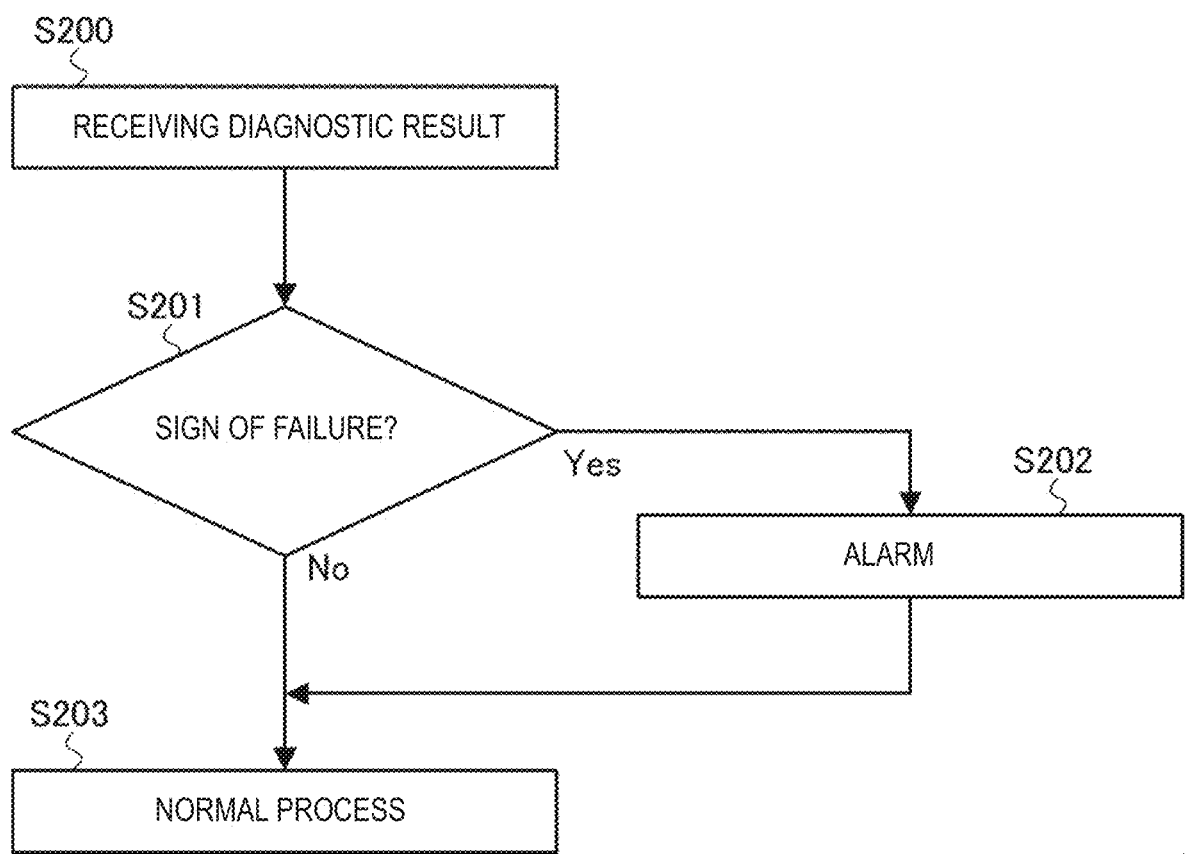
FIG. 8 is a flow chart illustrating an example of an operation when the MCU receives a diagnostic result from the server.

FIG. 8 is a flow chart showing an exemplary operation performed when the MCU 100 receives a diagnostic result from the server 200. Hereinafter, the flow of the MCU 100 operation when the diagnostic result is received will be described with reference to FIG. 8. In step S200, the MCU 100 receives a diagnostic result of the status of the MCU 100 from the server 200. The MCU 100 receives the diagnostic result of the MCU 100 from the server 200, for example, as one of the processes in the startup process at the time of startup. If a diagnostic result indicating that there is a sign of failure is received (YES in step S201), the MCU 100 outputs an alarm (step S202) and then performs a normal process (step S203). If the diagnostic result indicating that there is a sign of failure is not received (No in step S201), the MCU 100 performs the normal process without outputting an alarm (step S203).

The first embodiment has been described above. According to the present embodiment, as described above, the analysis data storage unit 153 stores the analysis data in which the error information and the stress data are associated with each other. Therefore, according to such analysis data, it is possible to perform analysis focusing on the relationship between the error, the accumulated stress value at the time of occurrence of the error, and the accumulated operation time at the time of occurrence of the error. Thus, a more useful analysis for the predictive maintenance of a device failure is possible.

Second Embodiment

Next, Embodiment 2 will be described. The occurrence of errors may be related to how much stress has accumulated, or may be related to other indicators. In other words, the occurrence of an error may be related to a sharp increase in stress per unit time. Therefore, in the present embodiment, a configuration in which analysis of analysis data is performed focusing on an increase amount of stress per unit time will be described.

The analysis system 10 according to the second embodiment will be described below. The configuration of the analysis system 10 according to the second embodiment has the same configuration as that of the analysis system 10 according to the first embodiment. That is, the analysis system 10 according to the second embodiment has the configuration shown in FIGS. 2 to 6. However, in the second embodiment, the memory 102 includes at least a nonvolatile memory such as a flash memory. In the following description, this nonvolatile memory is referred to as a nonvolatile memory 102. The second embodiment differs from the first embodiment in the storage procedure of data for analysis. Further, in the second embodiment, as described above, analysis is performed focusing on the increase amount of stress per unit time. In the following description, different points from the first embodiment will be described with reference to flowcharts.

Figure 9:
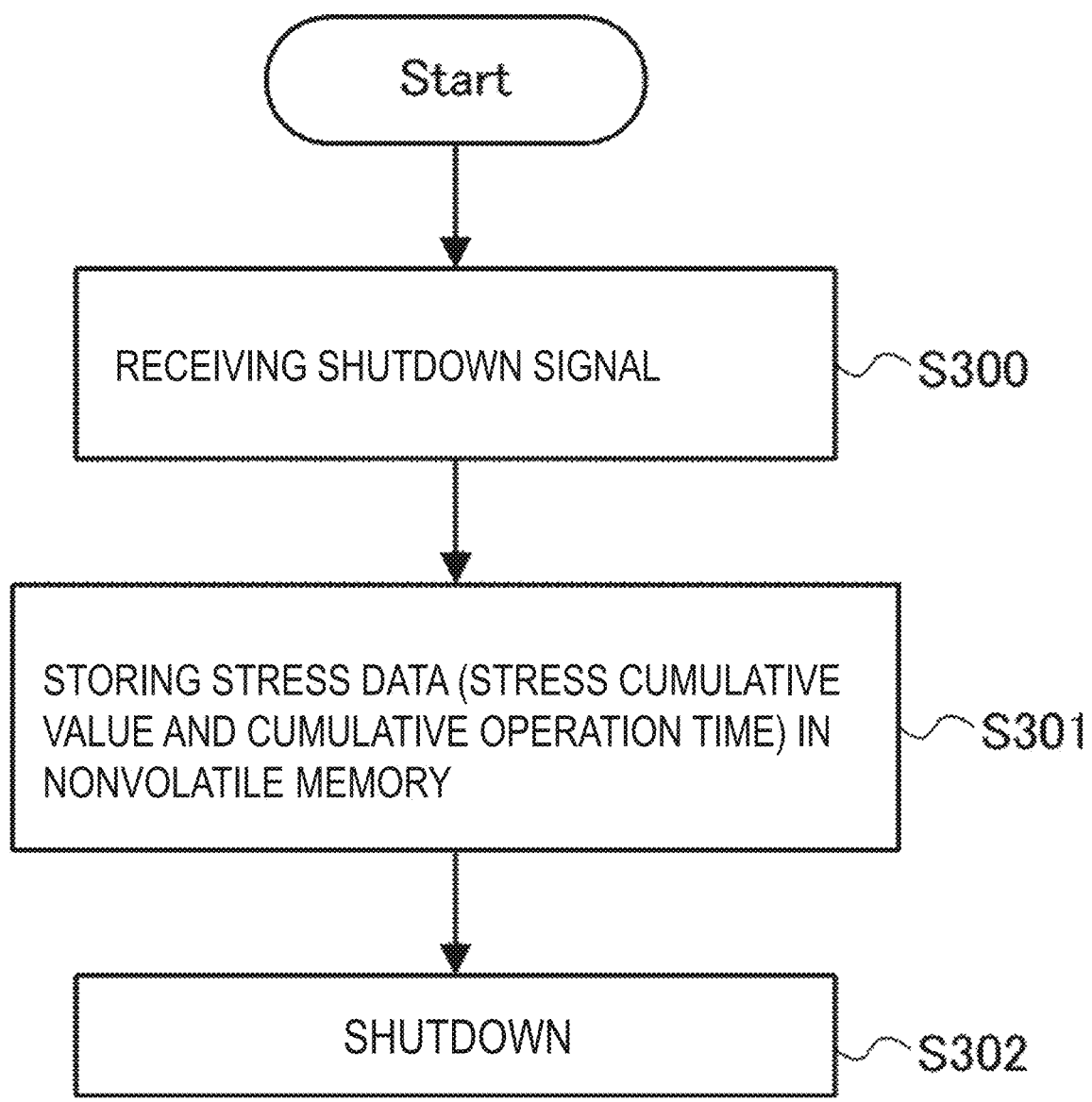
FIG. 9 is a flow chart illustrating an example of the operation of the MCU at the time of shutdown (normal completion)

FIG. 9 is a flow chart showing an exemplary operation of the MCU 100 at the time of shutdown. In step S300, the MCU 100 receives a signal indicating a shutdown. Next, in step S301, the analysis data storage unit 153 stores the present stress data (accumulated stress values and accumulated operation times) as analysis data in the nonvolatile memory 102. Thereafter, in step S302, the MCU 100 shuts down. Therefore, regardless of whether an error is detected or not, each time the shutdown is performed, one set of analysis data is stored in the nonvolatile memory 102.

In the present embodiment, as an example, an operation example in which the stress data saving process is performed every time the shutdown is performed has been described, but the stress data saving process may be performed at predetermined periodic timings during the MCU 100 operation. That is, the analysis data storage unit 153 may store the analysis data associating the accumulated stress value and the accumulated operation time at the time of the storage timing with each other at a predetermined storage timing. Such analysis data stored at a storage timing other than when an error occurs may be referred to as predetermined point-in-time data.

Figure 10:
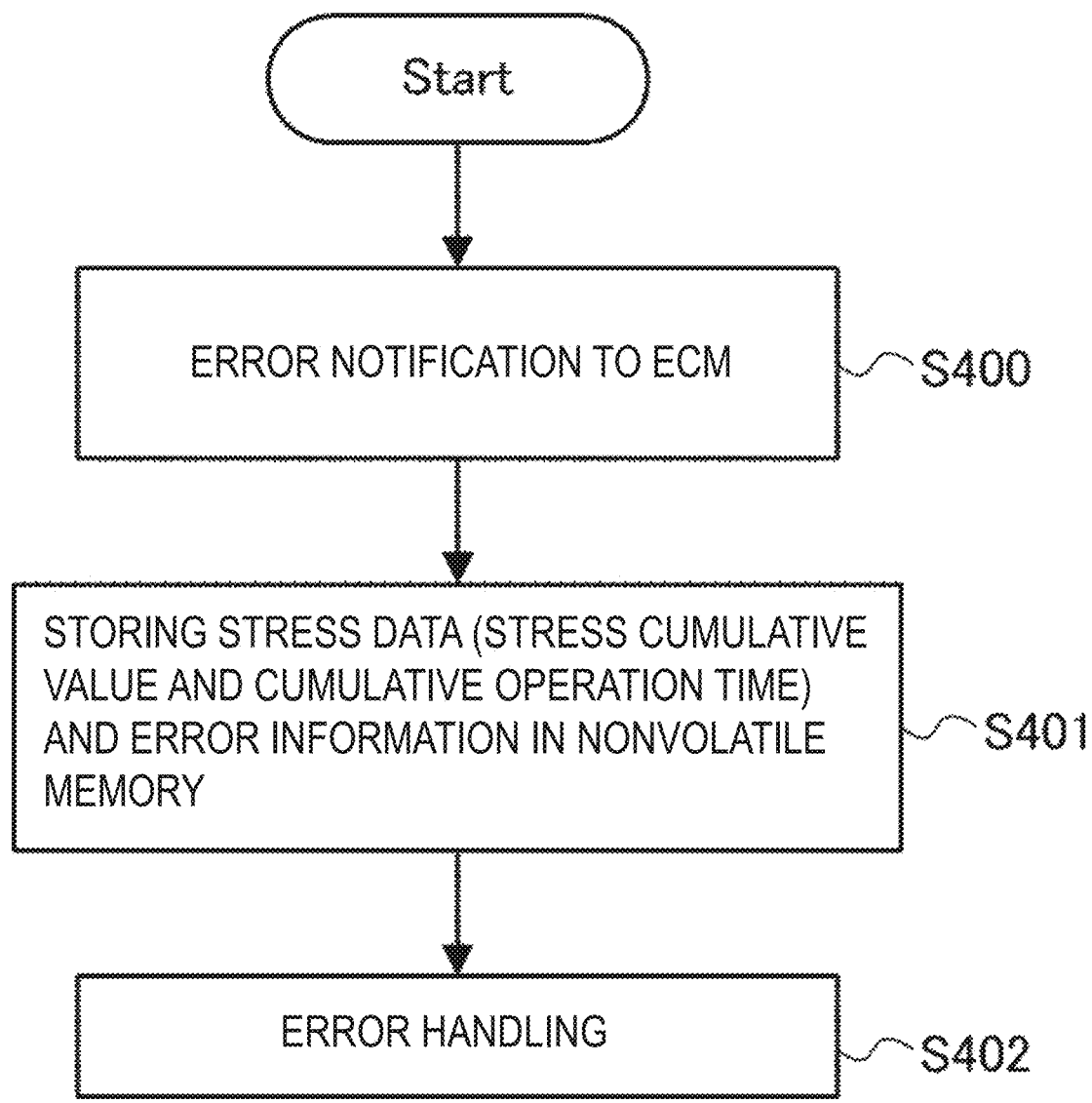
FIG. 10 is a flow chart illustrating an example of the operation of the MCU when an error detection is notified to the ECM by the error detection unit.

FIG. 10 is a flow chart showing an exemplary operation of the MCU 100 when error detection is notified to the ECM 106 from the error detection unit 104. In step S400, the error detection unit 104 detects an error and outputs a signal indicating that the error has been detected to the ECM 106. The error information about the error detected in the step S400 is referred to as error information ER1.

Next, in step S401, the analysis data storage unit 153 associates the error information ER1 with the present stress data (i.e., the stress data at the time of error occurrence) and stores it as analysis data in the nonvolatile memory 102. At this time, the analysis data storage unit 153 stores the error information ER1 analysis data without overwriting or deleting the latest analysis data stored in the nonvolatile memory 102 prior to the storage in the step S401. As described above, the nonvolatile memory 102 stores the stress data at the time of occurrence of the error and the stress data stored at the immediately preceding storage timing.

The stress cumulative value in the latest analysis data which has been stored at the time immediately before the step S401, in other words, the stress cumulative value in the analysis data which has been stored at the storage timing immediately before the storage timing in the step S401 (i.e., at the time of shutdown or at the time of detecting errors) is referred to as a stress cumulative value CT0. Similarly, the cumulative operation time in the latest analysis data stored in the latest analysis data is referred to as the cumulative operation time TM0. The stress cumulative value associated with the error-information ER1 in the analysis data is referred to as a stress cumulative value CT1. Similarly, the accumulated operation time associated with the error-information ER1 is referred to as an accumulated operation time TM1.

Next, in step S402, predetermined processing (error processing) corresponding to an error such as a reset or the like is performed based on the control of the ECM 106.

Figure 11:
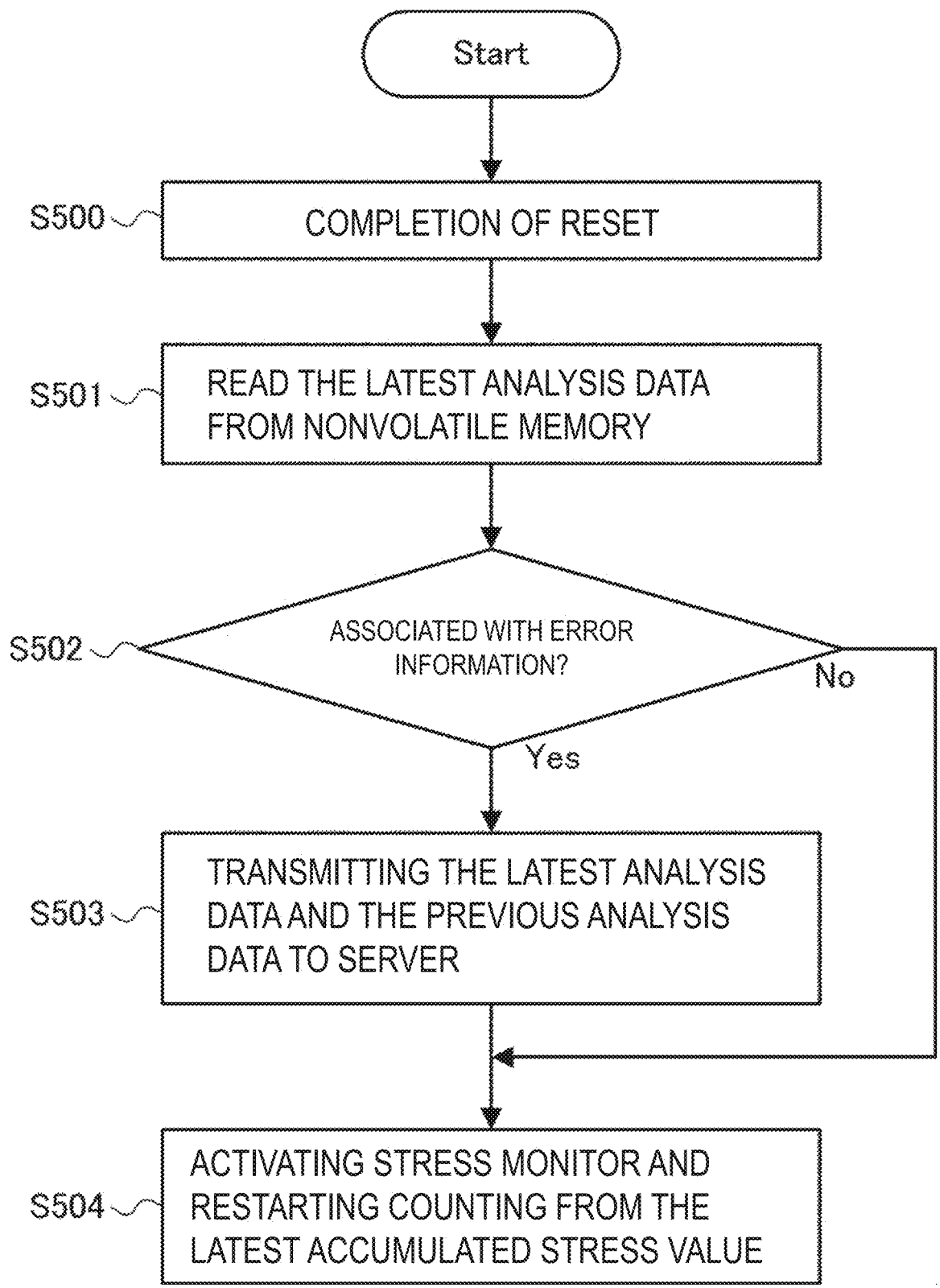
FIG. 11 is a flow chart illustrating an example of the operation of the MCU when a reset is completed.

FIG. 11 is a flow chart showing an exemplary operation of the MCU 100 when the reset is completed. In step S500, the MCU 100 completes the reset process. The reset completed in this step may be a reset at the time of normal operation such as a power-on reset, or may be a forced reset at the time of occurrence of an error.

In step S501, the analysis data storage unit 153 reads the latest analysis data stored in the nonvolatile memory 102.

Next, in step S502, the analysis data storage unit 153 determines whether the analysis data read in step S501 is data stored when errors occur or not. Specifically, the analysis data storage unit 153 performs this determination based on whether the stress data included in the analysis data is associated with the error information or not. If the data for analysis read in step S501 is data stored when errors occur, the process proceeds to step S503, otherwise, the process proceeds to step S504.

In step S503, the analysis data storage unit 153 reads out the analysis data stored at the previous storage time, that is, the second new analysis data stored at the time of step S503 from the nonvolatile memory 102, and transmits the analysis data read out in step S501 to the server 200. That is, the analysis data storage unit 153 stores two sets of analysis data in the server 200. As a result, in step S503, for example, the accumulated stress value CT0, the accumulated operation time TM0, the error information ER1, the accumulated stress value CT1, and the accumulated operation time TM1 are transmitted to the server 200. After step S503, the process proceeds to step S504.

In step S504, the stress monitor 105 is activated to restart counting from the latest accumulated stress value stored in the nonvolatile memory 102. That is, the stress monitor 105 starts adding the stress value to the latest accumulated stress value read from the nonvolatile memory 102, and starts adding the operation time to the latest accumulated operation time read from the nonvolatile memory 102.

Figure 12:
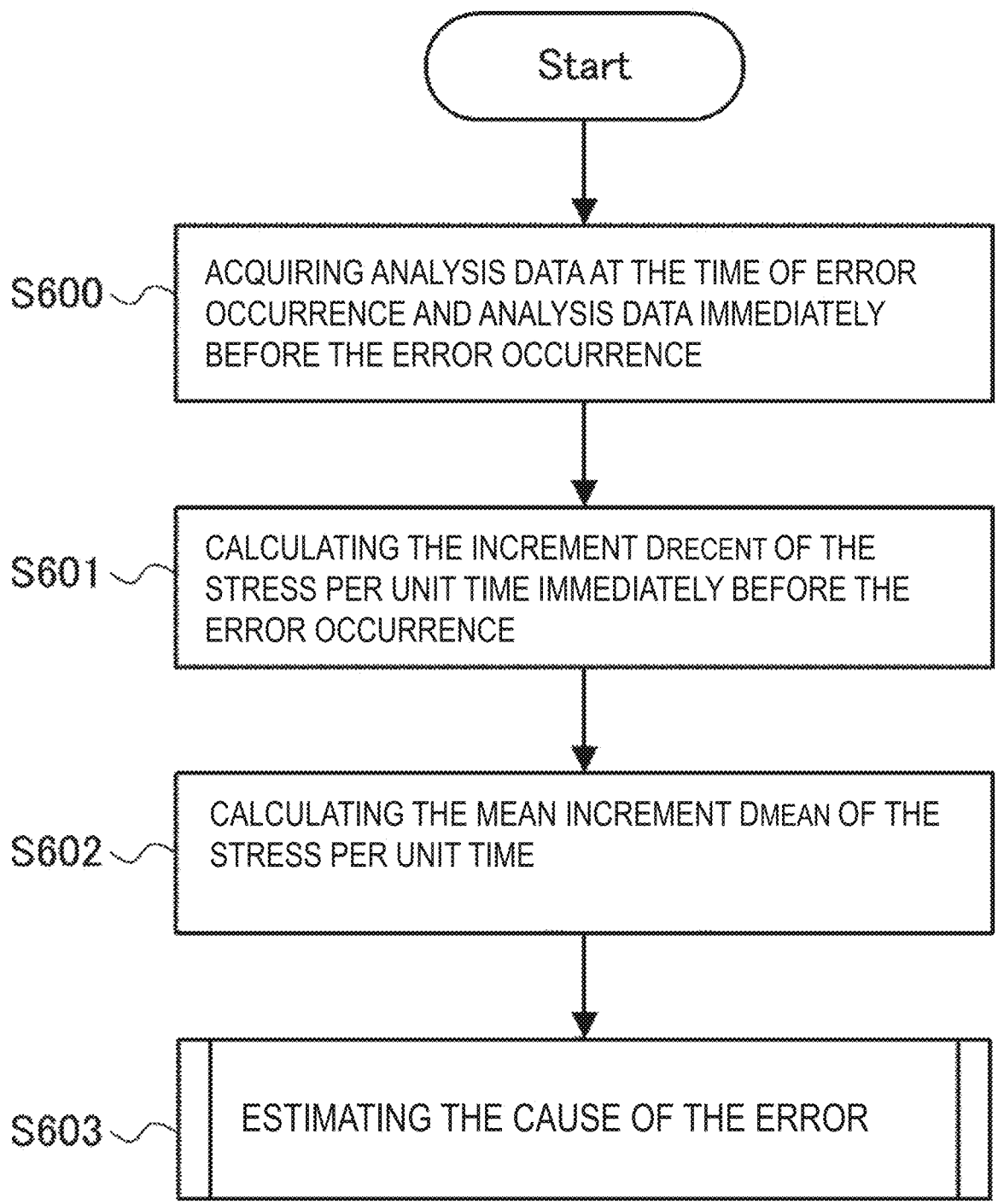
FIG. 12 is a flow chart showing an example of the analysis processing using data when an error occurs and previous data.

Next, an analysis process using the two sets of analysis data transmitted in the above-described step S503 will be described. As described below, this analysis processing includes an analysis focusing on an increase amount of stress per unit time. FIG. 12 is a flowchart showing an example of analysis processing based on the analysis data at the time of occurrence of an error and the analysis data immediately before the error. In this example, the server 200 performs the analysis process.

In step S600, the analysis unit 210 acquires the data for analysis at the time of occurrence of errors in the MCU 100 and the data for analysis immediately before the occurrence of errors. That is, the analysis unit 210 acquires the accumulated stress value CT0, the accumulated operation time TM0, the error-information ER1, the accumulated stress value CT1, and the accumulated operation time TM1.

Next, in step S601, the analyzing unit 210 calculates the increase DRECENT of the stress per unit time immediately before the occurrence of the error. The analyzing unit 210 calculates the increment DRECENT by calculating, for example, the following equation (1).

$$DRECENT=(CT1-CT0)/(TM1-TM0) \quad (1)$$

Next, in step S602, the analyzing unit 210 calculates a mean increment DMEAN of the stress per unit time. Specifically, the average value of the increase amount per unit time is calculated based on the stress data immediately before the stress data at the time of occurrence of the error. That is, the analyzing unit 210 calculates the increment DMEAN by calculating, for example, the following equation (2).

$$DMEAN=CT0/TM0 \quad (2)$$

Next, in step S603, the analysis unit 210 estimates the causes of the errors. That is, the analysis unit 210 estimates the cause of the error indicated by the error data ER1. This specific processing procedure is shown in FIG. 13.

Figure 13:
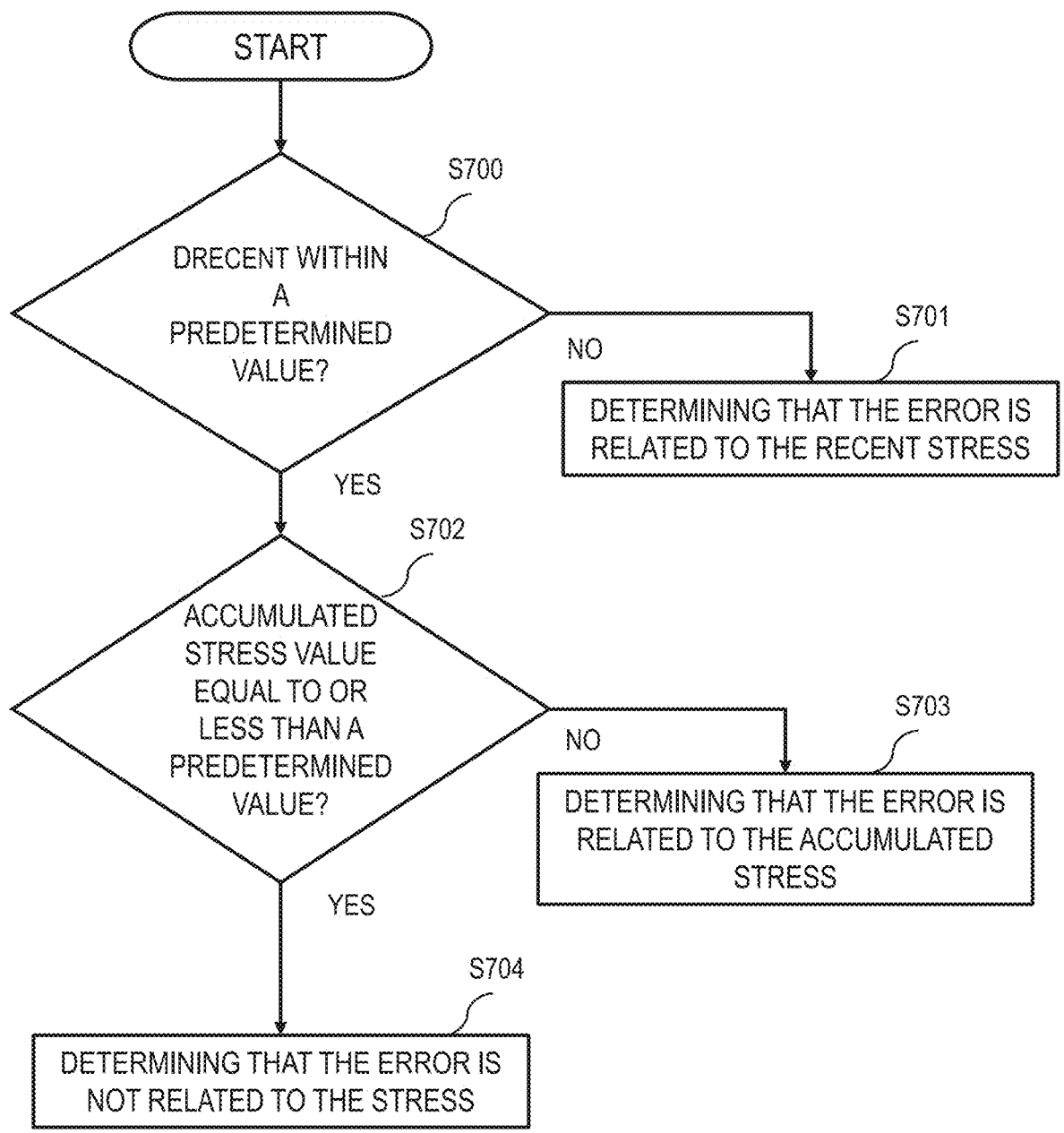
FIG. 13 is a flow chart illustrating an example of a procedure for determining the relationship between stress data and errors.

FIG. 13 is a flowchart showing an example of a procedure for determining a relationship between stress data and an error. That is, FIG. 13 is a flow chart showing a specific flow of the step S603 of FIG. 12. In step S700, the analysis unit 210 determines whether the increased stress DRECENT calculated in step S601 falls within a predetermined reference range or not. Specifically, the analyzing unit 210 determines whether the difference between the increase amount DRECENT and the increase amount DMEAN is equal to or less than a predetermined threshold value. This threshold value is a threshold value which is set in advance in consideration of a variation which is assumed in advance as an increase amount of stress per unit time. When the increase amount DRECENT is not within the predetermined reference range (NO in step S700), that is, when the difference between the increase amount DRECENT and the increase amount DMEAN exceeds the predetermined threshold, the analysis unit 210 determines that the error indicated by the error data ER1 is related to the stress in the immediate vicinity of the occurrence of the error (step S701). That is, in this instance, it is presumed that there was an environmental change leading to an increased stress on the MCU 100 immediately before the occurrence of the error, and it can be presumed that the stress caused by this environmental change caused the occurrence of the error.

If the increment DRECENT is within the predetermined reference range (YES in step S700), the step S702 is determined. In step S702, the analysis unit 210 determines whether the accumulated stress value is equal to or less than a predetermined reference value or not. That is, the analysis unit 210 determines whether or not the accumulated stress value has reached a level at which aging degradation is to be considered. Specifically, the analysis unit 210 determines whether the accumulated stress value CT0 is equal to or less than a predetermined reference value or not. When the stress cumulative value CT0 exceeds the reference value (No in Step S702), that is, when the stress cumulative value CT0 reaches a level at which aging degradation is to be considered, the analyzing unit 210 determines that the error indicated by the error data ER1 is related to the accumulated stress (Step S703). That is, in this case, it can be inferred that the accumulated stress caused the occurrence of the error.

On the other hand, when the stress cumulative value CT0 is equal to or less than the reference value (YES in step S702), the analysis unit 210 determines that the error indicated by the error data ER1 is independent of the stress (step S704).

Figure 14:
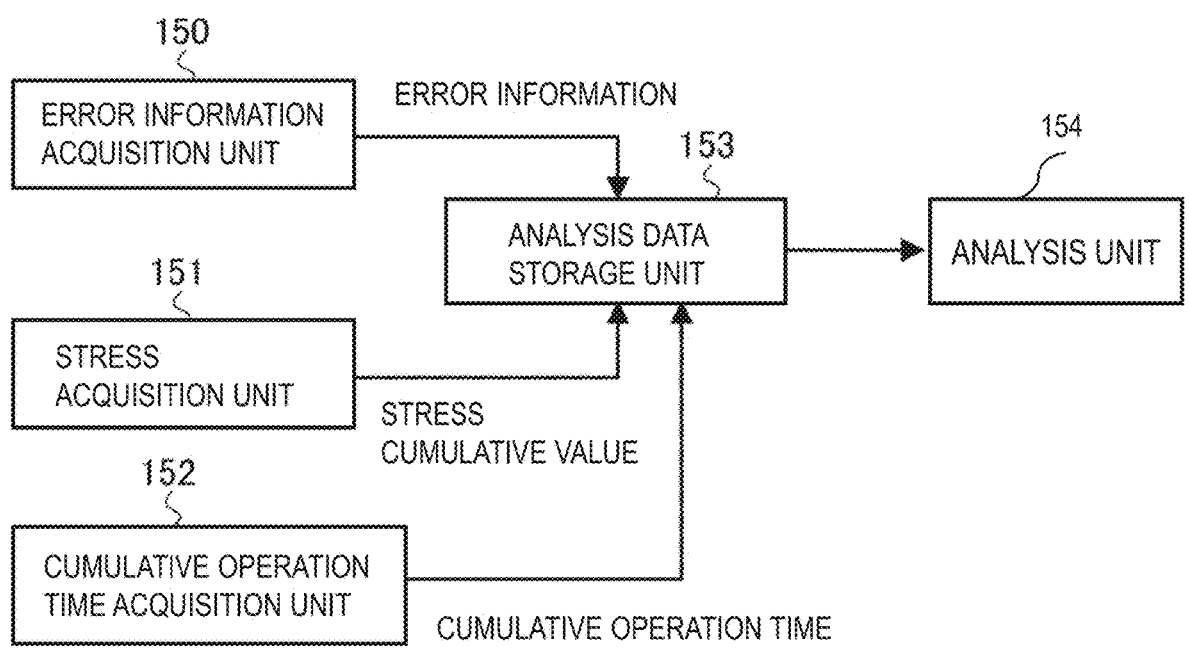
FIG. 14 is a block diagram illustrating an example of the functional configuration of the MCU when the analysis process is performed by the MCU.

Although the accumulated stress value CT0 is compared with the reference value in step S702, the accumulated stress value CT1 may be compared with the reference value. Also, although the above description illustrates an example in which the server 200 performs the analysis process illustrated in FIGS. 12 and 13, some or all of the same may be performed by the MCU 100. FIG. 14 is a block diagram showing an exemplary functional configuration of the MCU 100 when the MCU 100 performs the analysis process. As shown in FIG. 14, this MCU 100 differs from the configuration shown in FIG. 4 in that an analyzing unit 154 is added. The analyzing unit 154 executes the processing shown in FIGS. 12 and 13, for example, by the processor 101 executing a program.

The second embodiment has been described above. As described above, the analysis data storage unit 153 not only stores the stress data associated with the error information at the time of occurrence of an error as the analysis data, but also intermittently stores the stress data not associated with the error information as the analysis data at a predetermined storage timing, similarly to the first embodiment. That is, the stored analysis data group includes not only the analysis data at the time of occurrence of the error but also the analysis data immediately before the time of occurrence of the error. In the present embodiment, both data for analysis can be provided for analysis. Therefore, it is possible to perform a more diverse analysis as compared with the analysis focusing only on the stress data at the time of occurrence of the error. In particular, as shown in FIG. 12 and FIG. 13, the analyzing unit 210 or 154 analyzes the condition of the MCU 100 by evaluating the increase in stress immediately before the occurrence of the error based on the analysis data at the occurrence of the error and the analysis data immediately before the occurrence of the error. Therefore, the causal relationship between the immediately preceding increase in stress and the occurrence of error can be analyzed. Further, as shown in the step S702 of FIG. 13, the analyzing unit 210 or 154 further analyzes the MCU 100 state by evaluating the stress cumulative value at the time of occurrence of the error or the stress cumulative value immediately before the time of occurrence of the error. Therefore, the causal relationship between the accumulated stress amount and the error occurrence can be analyzed.

Third Embodiment

Next, Embodiment 3 will be described. In Embodiment 2, the embodiment has been described in which the analysis shown in FIGS. 12 and 13 is performed using the stress data at the time of occurrence of an error and the stress data stored at the immediately preceding storage timing. In the third embodiment, a system for performing analysis by machine learning will be described. Hereinafter, description of the same configuration and operation as those of the second embodiment will be omitted, and different points will be described. It should be noted that it is also possible to combine the features of Embodiment 3 described below with Embodiment 2 to form a new embodiment.

Figure 15:
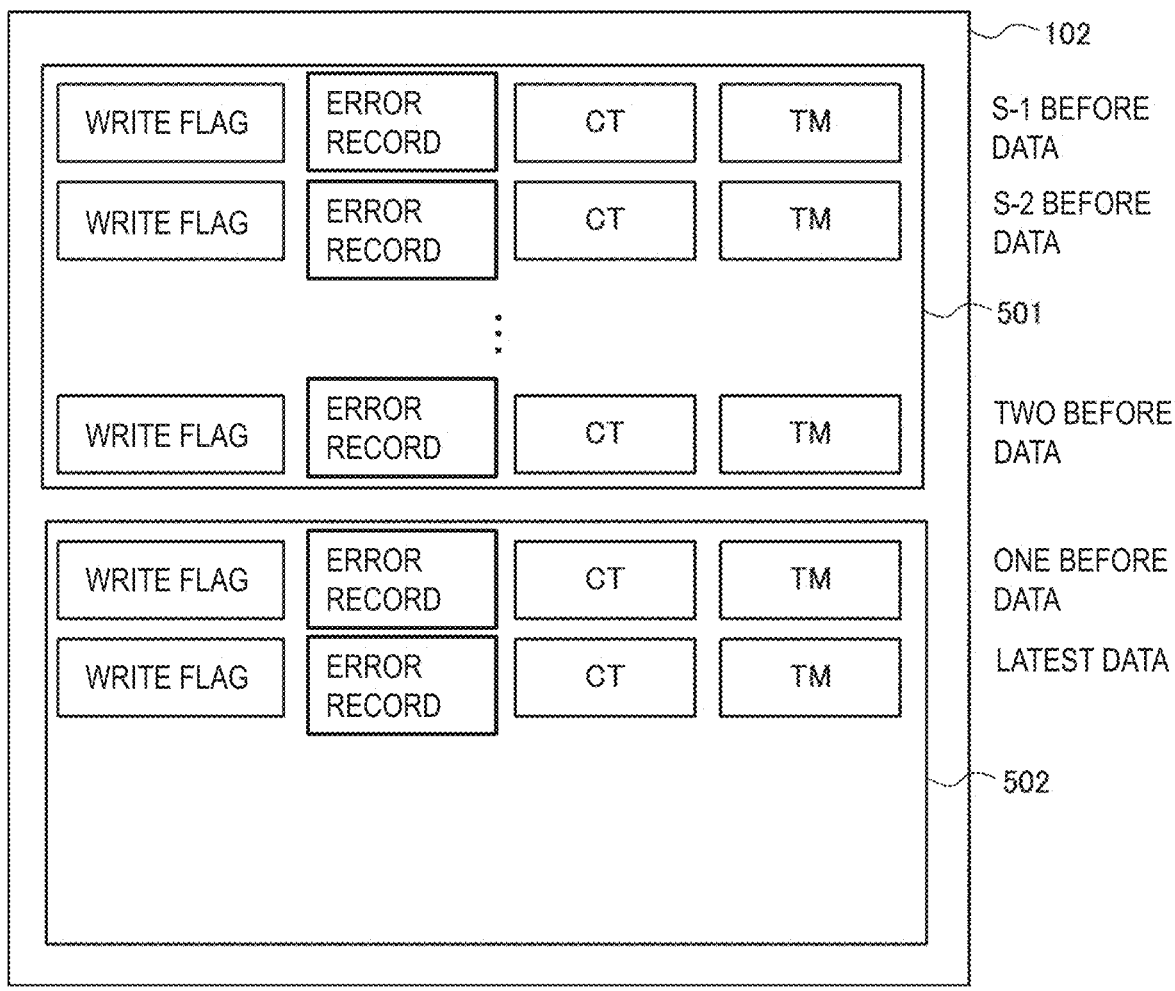
FIG. 15 is a schematic diagram illustrating an example of a storage content of a non-volatile memory.

FIG. 15 is a schematic diagram showing an example of the contents stored in the nonvolatile memory 102 according to the third embodiment. In the example shown in FIG. 15, the nonvolatile memory 102 is, for example, a flash memory, and includes an erase block 501 and an erase block 502. The erase block is a minimum unit memory area for erasing data in the nonvolatile memory 102, and is composed of a plurality of write unit areas. In FIG. 15, the write flag is a flag provided for each region of the write unit, and indicates whether the write process is performed after erasing the area. In addition, CT represents a stress cumulative value, and TM represents a cumulative operation time. The error record information is information indicating whether CT and TM are associated with the error information or not. The error record information includes the error information when CT and TM are associated with the error information. Therefore, when CT and TM are associated with error information, the error record information corresponds to the error information. That is, the error record information is error information associated with the CT and TM included in the analysis data when the analysis data stored in the nonvolatile memory 102 is at the time of occurrence of an error, and is information indicating that the error information is not associated with the CT and TM included in the analysis data when the analysis data stored in the nonvolatile memory 102 is not at the time of occurrence of an error.

The erase blocks 501 and 502 can be written with up to s−2 sets of data, where s is an integer greater than or equal to 4. When the total number of sets of data stored in the nonvolatile memory 102 reaches s, the analysis data storage unit 153 stores the s−2 sets of data, transmits the data of the erased block in the full state to the server, and erases the data of the erased block. In the example shown in FIG. 15, two sets of a write flag, error recording information, CT, and TM are written in the erase block 502. The erase block 501 stores s−2 sets of data and is in a full state. Note that the two sets of data stored in the erase block 502 are the most recent two sets of data for analysis, and the s−2 sets of data stored in the erase block 501 are the data for analysis stored earlier than them. In the example shown in FIG. 15, the analysis data storage unit 153 transmits the s−2 sets of data stored in the erase block 501 to the server 200, and erases the erase block 501. As a result, the most recent two sets of analysis data are left in the nonvolatile memory 102, and the server 200 stores the previous s−2 sets of analysis data in the server 200.

In this manner, control is performed so that two or more sets of data remain in the nonvolatile memory 102. Therefore, when the latest data is associated with the occurrence of an error, the analysis unit 154 of the MCU 100 can infer the cause of the occurrence of the error by using the methods shown in FIGS. 12 and 13, for example. Since many sets of analysis data are transmitted to the server 200, a learned model for error occurrence prediction can be constructed using these analysis data, and prediction using this learned model can be performed, as will be described later. Further, as described above, since a plurality of sets are collectively transmitted to the server 200, the number of communications can be reduced.

Figure 16:
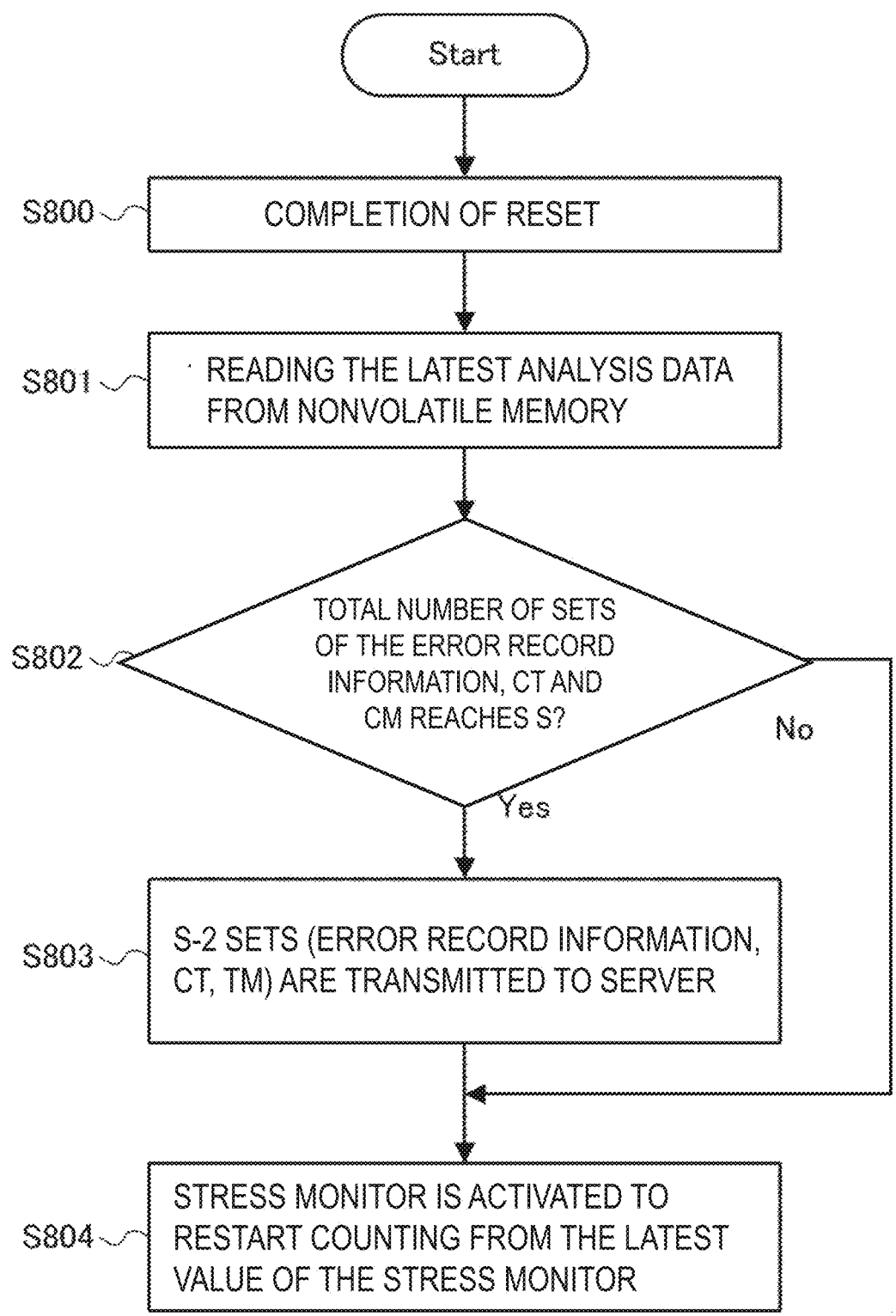
FIG. 16 is a flow chart illustrating an example of the operation of the MCU when the reset is completed.

In the third embodiment, the operation of the MCU 100 at the time of completion of resetting is the flow shown in FIG. 16 instead of the flow shown in FIG. 11. FIG. 16 is a flow chart showing an exemplary operation of the MCU 100 when reset is completed in the third embodiment. The difference from the flow chart shown in FIG. 11 is that, as shown in step S802 and S803, when the data stored in the non-volatile memory 102 (a set of data consisting of error recording information, CT, and TM) reaches a predetermined set number s, a set of s−2 is transmitted to the server 200. Hereinafter, description will be made with reference to FIG. 16.

In step S800, the MCU 100 reset process is completed. Next, in step S801, the analysis data storage unit 153 reads out the latest analysis data stored in the nonvolatile memory 102. Next, in step S802, the analysis data storage unit 153 determines whether the total number of sets of the error record information, CT, and TM stored in the nonvolatile memory 102 has reached a predetermined set number s or not. If the number of sets stored in the nonvolatile memory 102 has reached s (Yes in step S802), the process proceeds to step S803, otherwise (No in step S802), the process skips step S803 and proceeds to step S804. In step S803, the analysis data storage unit 153 transmits s−2 sets of analysis data (i.e., error-recording data, CT, TM) stored in the non-volatile memory 102 to the server 200. After step S803, the process proceeds to step S804. In step S804, the stress monitor 105 is activated to restart counting from the latest stress monitor values stored in the nonvolatile memory 102.

Figure 17:
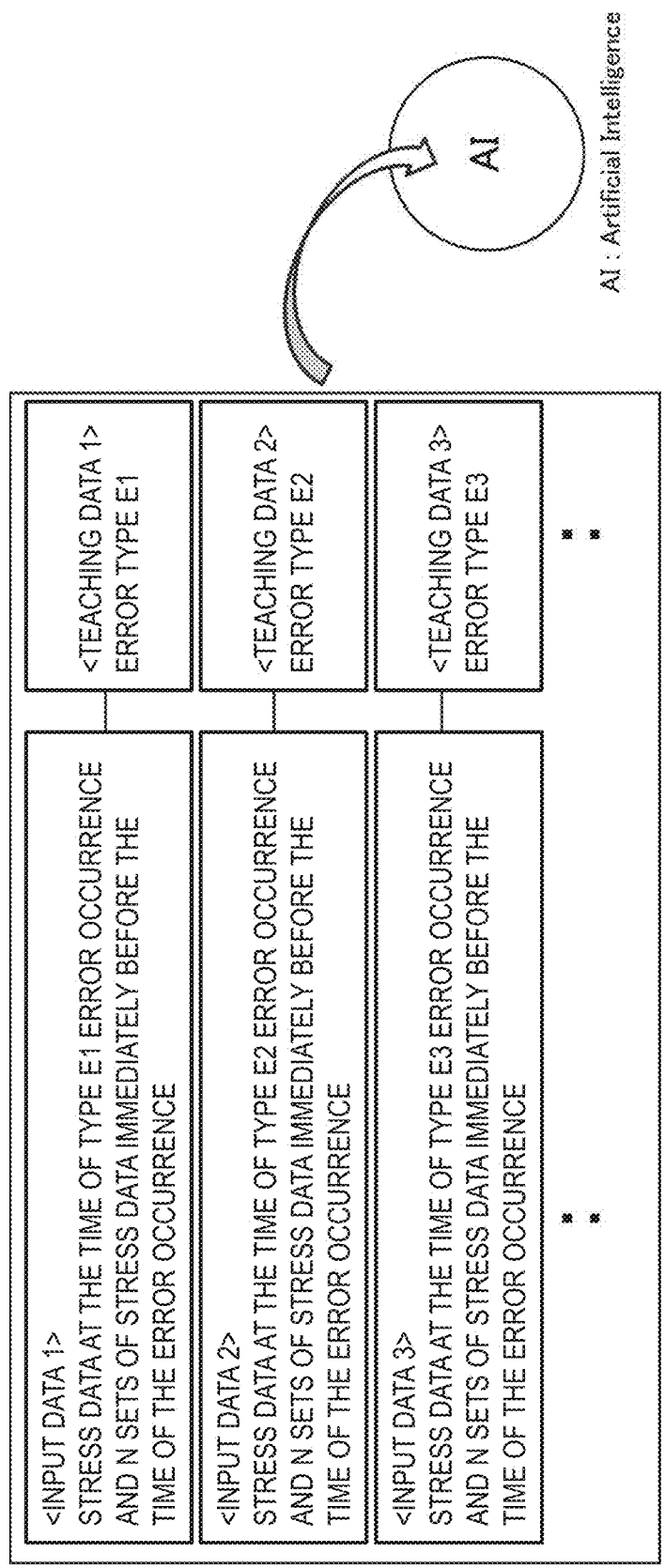
FIG. 17 is a schematic diagram of a method for constructing a model that can predict the occurrence of errors.

Next, the construction of a model based on the data transmitted to the server 200 will be described. FIG. 17 is a diagram schematically showing a method for constructing a model capable of predicting occurrence of an error. As described above, the analysis data transmitted to the server 200 includes error record information and stress data, i.e., CT and TM. When the error record information includes error information, the error type can be specified by the error information. Therefore, in the data for analysis at the time of occurrence of an error, the error type and the stress data are associated with each other. The analysis unit 210 of the server 200 constructs a model for predicting an error using training data including these stress data associated with the error type and a known AI (Artificial Intelligence). For example, the training data is a data set as follows. That is, one set of training data is a set including data for analysis at the time of occurrence of a certain error, and is a set of data for analysis of n sets (n is an integer equal to or greater than 1) immediately before the time of occurrence of the error. Various training data are generated from the analysis data transmitted from the various MCU 100. For this reason, a large number of training data are accumulated in the server 200. The stress data constituting the training data is used as input data in machine learning, and the error type is used as teaching data.

Figure 18:
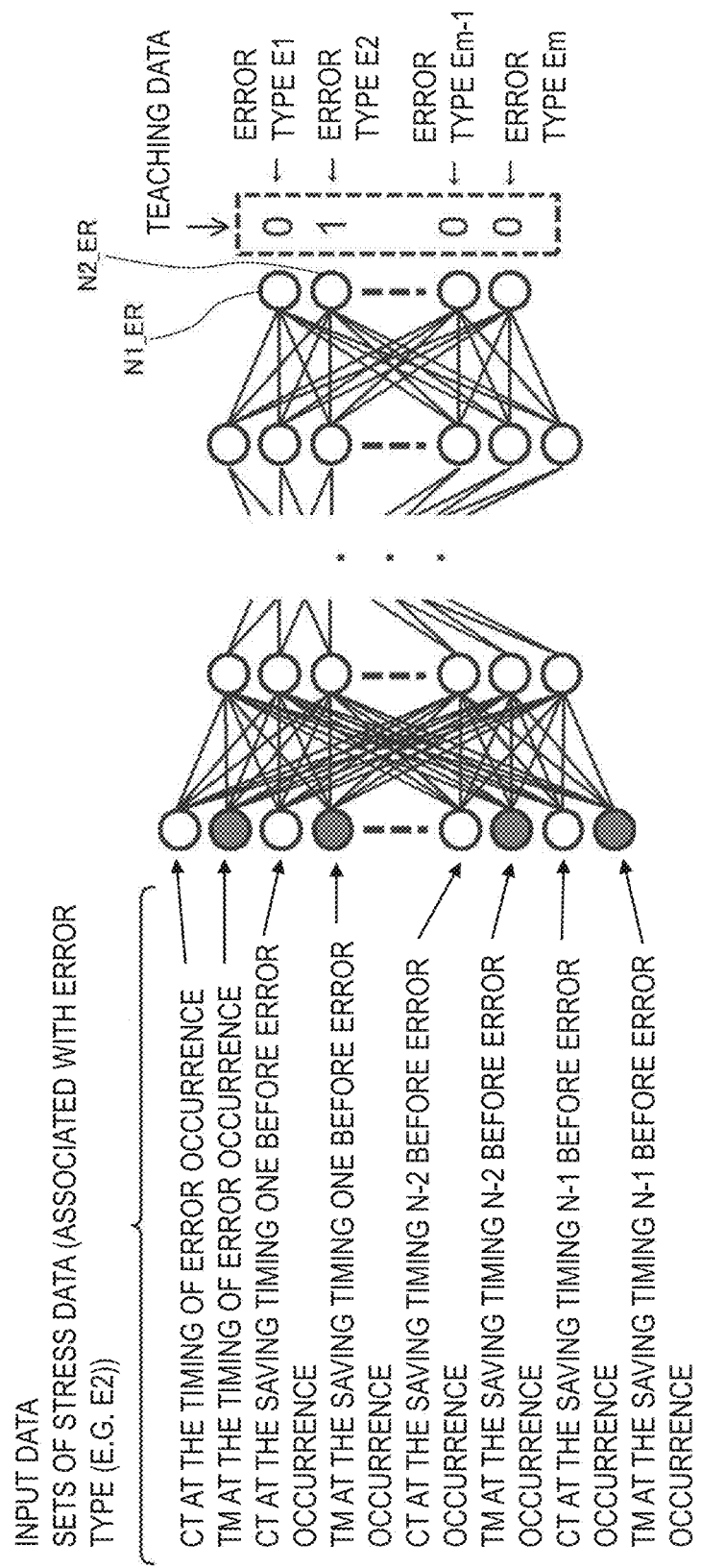
FIG. 18 is a schematic diagram illustrating an example of input/output of a model in a learning phase.
Figure 19:
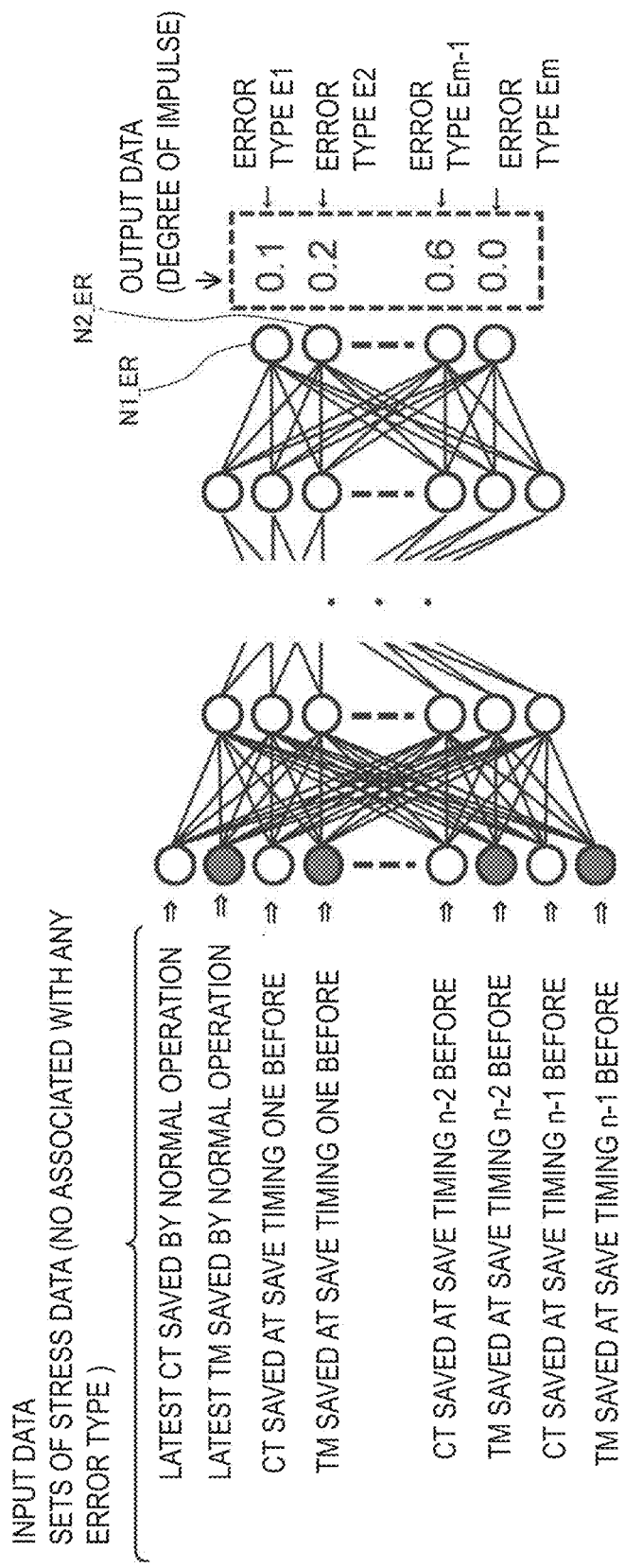
FIG. 19 is a schematic diagram illustrating an example of the input/output of the model in an inference phase.

The analysis processing of the analysis unit 210 will be described with reference to an example in which the AI used for building the model, that is, the machine learning used for building the model is a neural network. Note that the neural network is an example, and the analysis unit 210 may construct and use a model using another machine learning method and the training data. FIG. 18 is a schematic diagram showing an example of input/output of a model in the learning phase. FIG. 19 is a schematic diagram showing an example of input/output of a model in the inference phase.

The output neuron constituting the output layer of the neural network is composed of a neuron N1_ER indicating the occurrence of an error type e1, a neuron N2_ER indicating the occurrence of an error type e2 different from the error type e1, and the like. In the training phase, for example, when a set of stress data is associated with the error type e2 in certain training data, learning is performed in the analysis unit 210 so that the neurons N2_ER impulse in response to the input of the set of stress data to the input layers of the neural network. The set of stress data included in the set of training data is n sets of the stress cumulative value CT and the cumulative operation time TM up to the time of occurrence of the error, as shown as input data in FIG. 18. The analysis unit 210 repeats the learning process as shown in FIG. 18 for a large number of training data obtained from the analysis data collected by the server 200. As a result of such learning, a learned model capable of predicting the occurrence of an error is constructed.

As shown in FIG. 19, in the inference phase, the analysis unit 210 inputs a set of stress data, which is not associated with any of the error types, to the input layers of the neural network, which are learned models. The set of inputted stress data is data for analysis of n sets of time series transmitted from the MCU 100. For this input, if the output-layer neurons Nm-1_ER impulse significantly selectively, an error of the error type em-1 will be indicated in the MCU 100 in the near future. That is, the predicted result that the error-type em-1 occurs is obtained from the output layer of the neural network. In the example shown in FIG. 19, the degree of impulse of the neuron Nm-1_ER is 0.6, and the degree of impulse is significantly larger than that of other output neurons. In this instance, the analysis unit 210 predicts the occurrence of an error in the error type em-1 in the MCU 100. That is, the analysis unit 210 predicts the occurrence of an error in the MCU 100 and the type of the error using the n sets of data for analysis of the time series and the learned models transmitted from the MCU 100. Although n sets of CT and TM are used as the input data in the above description, other data may be used instead of these. For example, instead of TM, the above-mentioned increase amount DRECENT and increase amount DMEAN may be used. In addition to the analysis of the machine learning described above, the analysis unit 210 may perform the analysis by the method shown in FIGS. 12 and 13.

The status notification unit 211 notifies the predicted result to the MCU 100 that provided the input data input to the learned models in the inference phase. For example, according to the above-described example, the status notification unit 211 notifies the MCU 100 that an error of the error type em-1 is expected to occur. In the above explanation, the analysis unit 210 of the server 200 performs the analysis by the machine learning, but part or all of the analysis by the machine learning may be performed by the analysis unit 154 of the MCU 100, for example.

The third embodiment has been described above. In the analysis system 10 according to the third embodiment, the analysis unit 210 generates a model by machine learning using training data including analysis data at the time of occurrence of an error. Therefore, it is possible to predict an error by a model learning the relationship between the error and the stress data. Since the learning is performed by distinguishing the error cause, the learning accuracy is improved. In particular, the analysis unit 210 generates a model by machine learning using a set of analysis data as a set of training data. This set is a set including data for analysis at the time of occurrence of an error, and is a set of data for analysis of n sets (n is an integer of 1 or more) immediately before the time of occurrence of the error.

Therefore, for example, when n is 2 or more, n−1 pieces of data for analysis before the occurrence of an error are also used as training data. Therefore, it is possible to predict the error by a model learning the relationship between the time-series transition of the stress data and the error. In the analysis system 10 according to the third embodiment, prediction using a learned model is possible. Thus, the risk of the MCU 100 reaching dysfunction can be avoided beforehand. Further, since the error information includes information of an error which does not lead to a failure of the semiconductor device by the function safety mechanism, it is possible to learn more analysis data than when only the analysis data for an error which appears as a failure is used. That is, the accuracy of learning is improved.

Fourth Embodiment

Next, Embodiment 4 will be described. In the second embodiment, the error information (error record information) at the time of occurrence of an error and the stress data (accumulated stress value and accumulated operation time) are stored in association with each other. In the present embodiment, in the configuration in which the value obtained by multiplying the count value of the predetermined period by p is used as the stress value and the accumulated value is used as the accumulated stress value, not only the accumulated stress value and the accumulated operation time but also the count value of the predetermined period at the time of occurrence of the error are temporarily stored. The above configuration is shown in, for example, Non-Patent Document 1, and in Embodiment 4, not only Acc_Cnt_T2 and Acc_Cnt_TM described in this Non-Patent Document 1 but also the latest Cnt1[$i$] are temporarily stored.

Figure 20:
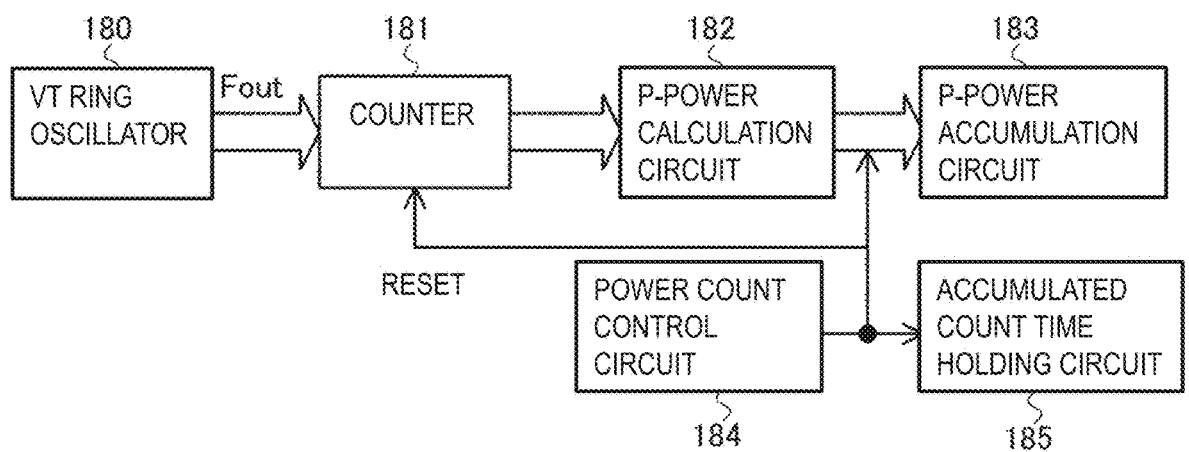
FIG. 20 is a block diagram illustrating an example of a configuration of a stress monitor.
Figure 21:
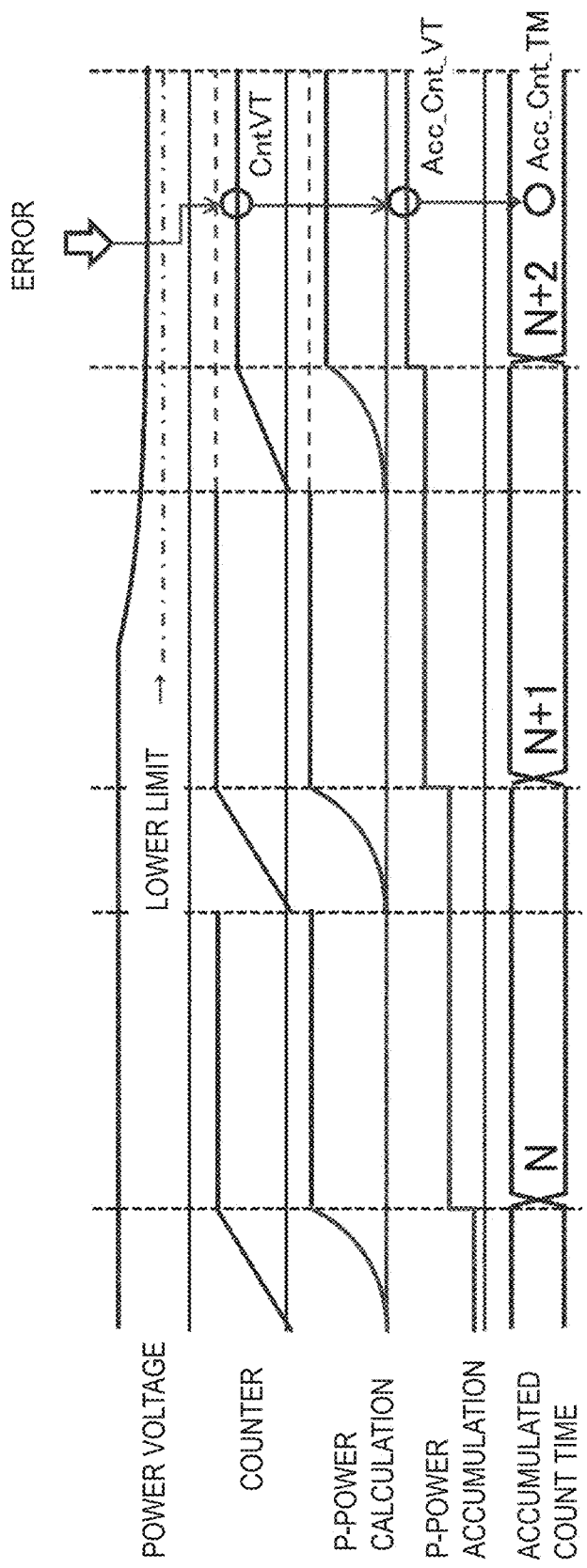
FIG. 21 is graph illustrating a waveform of each component of the stress monitor.

FIG. 20 is a block diagram showing an example of the configuration of the stress monitor 105 according to the fourth embodiment. FIG. 21 is a graph showing operation waveforms of the components of the stress monitor 105 according to the fourth embodiment. Hereinafter, Embodiment 4 will be described with reference to FIGS. 20 and 21. However, description of the same configuration and operation as those of the second embodiment will be omitted, and different points will be described. It should be noted that it is also possible to combine the features of Embodiment 4 described below with other embodiments to form a new embodiment.

As shown in FIG. 20, the stress monitor 105 according to the present embodiment includes a VT ring oscillator 180, a counter circuit 181, a p-power calculation circuit 182, a p-power accumulation circuit 183, a power count control circuit 184, and an accumulated count time holding circuit 185. With such a configuration, the stress monitor 105 counts stress data in a predetermined monitor cycle Tm, for example, 1 second.

The VT ring oscillator 180 is a ring oscillator whose oscillation frequency varies greatly as a function of the stress strength of a wear failure factor, which varies greatly based on both the power supply voltage V of the MCU 100 and the temperature T of the MCU 100. That is, the VT ring oscillator 180 is a ring oscillator having a predetermined temperature dependence and a predetermined voltage dependence. The VT ring oscillator 180 has a frequency characteristic such that the p-th power of the oscillation frequency is proportional to the inverse of the life of the wear failure factor. Therefore, by calculating the p-th power of the oscillation number of the VT-ring oscillator 180 and using the p-th power as an index of the stress, it is possible to easily evaluate the life of the MCU 100 caused by the wear failure factor. It should be noted that an oscillator, such as the VT-ring oscillator 180, is shown as a VT-sensitive RO in the aforementioned article.

The counter circuit 181 counts the number of oscillations of the VT ring oscillator 180 in a predetermined measurement period for each monitor period. That is, the oscillation-output Fout of the VT ring oscillator 180 is counted by the counter 181. In this manner, the counter circuit 181 performs an intermittent operation for counting the number of oscillations.

The p-power value calculation circuit 182 is a circuit for calculating a p-power value, which is a value obtained by multiplying the CntVT, which is the count value of the counter circuit 181, by p. That is, the p-power calculation circuit 182 multiplies the oscillation number of the VT ring oscillator 180 in a predetermined measurement period by p. Note that p is a natural number, and the value of p is set in advance in accordance with the wear failure factor. Specifically, the value of p is, for example, any one of 1 to 4.

The p-th power accumulation circuit 183 is a circuit for calculating the accumulated value of the p-th power value calculated by the p-th power calculation circuit 182. The cumulative stress count Acc_Cnt_VT, which is the cumulative value, corresponds to the cumulative stress value.

The accumulated count time holding circuit 185 counts the number of repetitions in the monitor cycle Tm and holds the count. The cumulative count time Acc_Cnt_TM, which is the count value, corresponds to the cumulative operation time.

The power count control circuit 184 is a circuit for controlling the count of stress data in the stress monitor 105. The power count control circuit 184 controls to add the p-th power value calculated by the p-th power calculation circuit 182 to the accumulated value held by the p-th power accumulation circuit 183 and resets the count value of the counter circuit 181 every monitor cycle Tm. The power count control circuit 184 controls the accumulated count time holding circuit 185 to increment the count value every monitor cycle Tm.

The operation of the stress monitor 105 will be described with reference to the operation waveforms shown in FIG. 21. When the counter circuit 181 counts up, the p-th power value of the count value of the counter circuit 181 calculated by the p-th power value calculation circuit 182 is periodically added to the accumulated stress count Acc_Cnt_VT held by the p-th power value accumulation circuit under the control of the power count control circuit 184. At that time, the cumulative count time Acc_Cnt_TM is incremented by 1 from N−1 to N. The value of the counter circuit 181 is held until the next count-up is started. In the next intermittent operation, the power count control circuit 184 resets the counter circuit 181, and the counter circuit 181 again counts the number of oscillations of the VT ring oscillator 180 for a predetermined measurement period. After a predetermined measurement period, the p-th power value of the count value of the counter circuit 181 is again added to the accumulated stress count Acc_Cnt_VT held by the p-th power value accumulation circuit 183. At this time, the cumulative count time Acc_Cnt_TM is incremented by 1 from N to N+1. During the operation of the MCU 100, such an operation is repeated in the stress monitor 105.

Here, it is assumed that after the cumulative count time Acc_Cnt_TM becomes N+2, the ECM 106 is notified of errors. In this embodiment, not only the cumulative stress count Acc_Cnt_VT and the cumulative count time Acc_Cnt_TM but also the count CntVT of the counter 181 at the time of occurrence of the error are stored in the nonvolatile memories 102 in association with the error. The count value CntVT of the counter circuit 181 at the time of occurrence of the error is a count value after the counter circuit 181 completes the count operation for a predetermined measurement period, and is a count value immediately after the occurrence of the error (immediately after the MCU 100 receives the notification of the error). Therefore, for example, when an error occurs during the count-up of the counter circuit 181 rather than during the period in which the counter circuit 181 holds the count value after the completion of the count-up, the error information, the cumulative stress count Acc_Cnt_VT, the cumulative count time Acc_Cnt_TM, and the count value CntVT are stored in the nonvolatile memory 102 after the count-up of the counter circuit 181 and the addition of the p-th power value are completed. This is to prevent the stress from being underestimated. If the count value CntVT is stored at a stage when the count time has not reached the predetermined measurement period, the count value becomes smaller than when the count value is waited until the predetermined measurement period is reached, and therefore, the stress in this monitoring period is underestimated. In order to prevent this, the above-described operation is performed.

The configuration and operation of the stress monitor 105 according to the fourth embodiment have been described above. In the present embodiment, as described above, the analysis data storage unit 153 stores data in which the error information (error recording information) is associated with the stress cumulative value (Acc_Cnt_VT), the cumulative operation time (Acc_Cnt_TM), and the count value (CntVT) at the time of occurrence of the error, as analysis data. Although the count value CntVT is stored in the above explanation, the p-th power value may be stored instead of the count value CntVT. The stored count value, or its p-th power, corresponds to the stress immediately prior to the occurrence of the error. For this reason, according to the present embodiment, by storing the count value CntVT, it is possible to store the stress value in the very latest period (e.g., 1 second or less) prior to the occurrence of the error. Therefore, when the stress abnormality that has occurred very recently is the cause of the error, the count value CntVT can be verified more clearly than the verification using the increase amount of the stress per unit time described in the second embodiment. In other words, it is possible to perform more effective analysis for failure prediction or the like. In addition, when the cause of the error is an extremely recent voltage drop, the error can be known by verifying the count value CntVT. This is because, due to the characteristics of the VT-ring oscillator 180 described above, when the power supply voltage decreases, the count value CntVT also decreases. Further, as shown in the power supply voltage waveforms of FIG. 21, even when the voltage drop does not reach the lower limit, the most recent voltage abnormality can be known from the count value CntVT. Here, the lower limit is a voltage level at which an abnormality of the power supply voltage (an abnormality in which the power supply voltage falls below the lower limit of the normal range) is detected by the voltage sensor. That is, abnormalities in the power supply voltages which are not detected by the abnormality determination using the lower limit can also be grasped from the counted values CntVT. Therefore, it is possible to perform more effective analysis for failure prediction or the like.

Fifth Embodiment

Next, Embodiment 5 will be described. The fifth embodiment is different from the above-described embodiment in that, when the error that has occurred is a memory ECC error, information as to whether the error is a hardware error or not is also stored as analysis data. Hereinafter, Embodiment 5 will be described with reference to the drawings. However, description of the same configuration and operation as those of the second embodiment will be omitted, and different points will be described. It should be noted that it is also possible to combine the features of Embodiment 5 described below with other embodiments to form a new embodiment.

When the error generated in the module 103 is an error in the data error of the memory (i.e., a memory ECC error), the analysis data storage unit 153 according to the present embodiment stores, as analysis data, data in which information indicating whether the error is a hardware error, error information (error recording information), and stress data at the time of occurrence of the error are associated with each other. Specifically, when an ECC error occurs in any memory of the MCU 100, the analysis data storage unit 153 performs a process of storing the stress data in the nonvolatile memory 102 or the server 200 in association with the error, and thereafter, when the error is determined to be a hard error, the analysis data storage unit 153 adds information indicating that the error is a hard error to the data set including the ECC error and the stress data.

Figure 22:
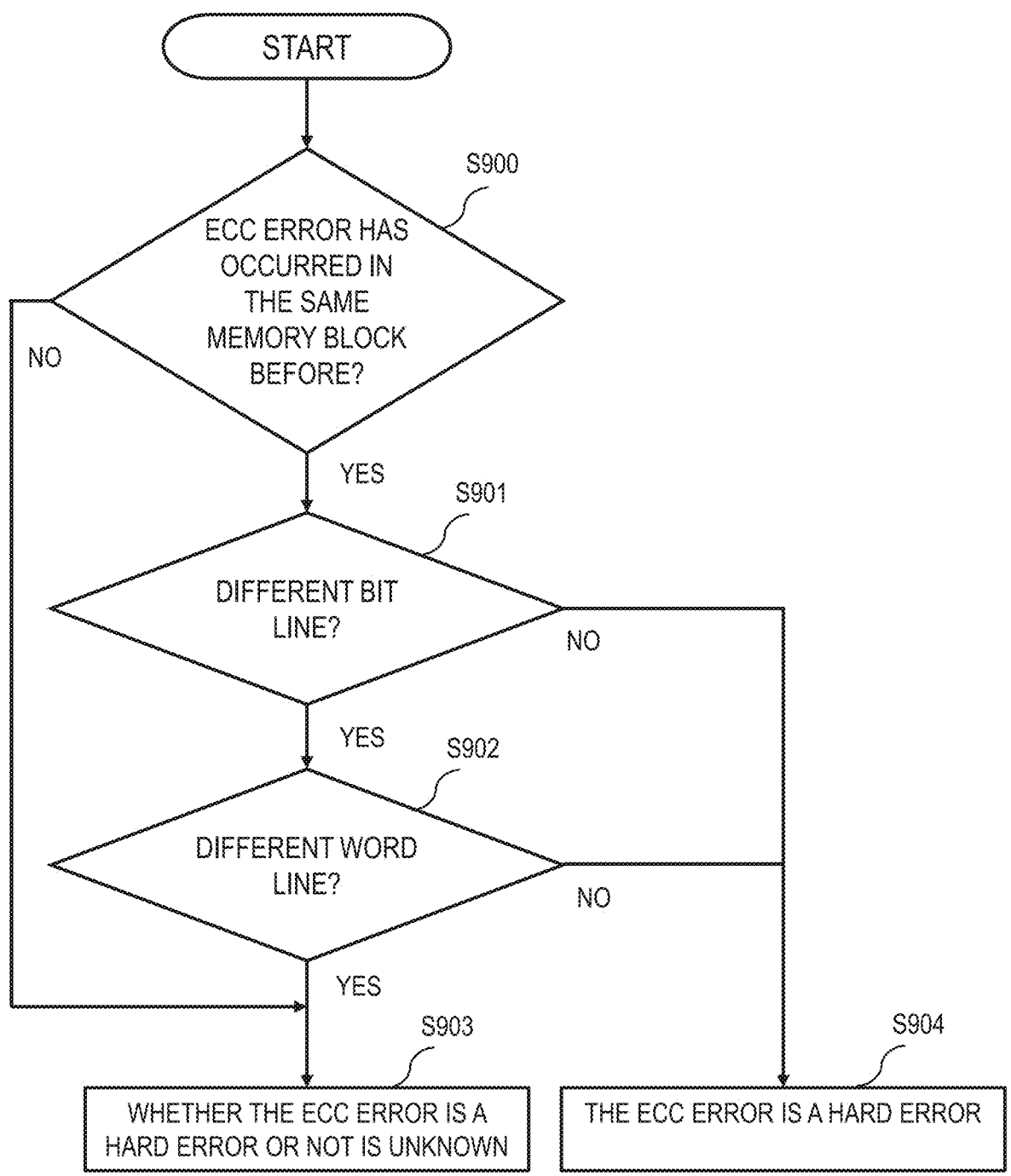
FIG. 22 is a flow chart illustrating an example of a method for determining whether an ECC error is a hardware error or not.

FIG. 22 is a flowchart showing an example of a method for determining whether an ECC error is a hard error. Hereinafter, the determination method will be described with reference to the flowchart shown in FIG. 22.

When an ECC error occurs, in step S900(S900), the analysis data storage unit 153 confirms whether an ECC error has occurred before in the same memory block or not. The error information includes a memory address at which an ECC error has occurred. Therefore, the analysis data storage unit 153 refers to the memory address included in the error information of the ECC error that has occurred before and the memory address included in the error information of the ECC error that has occurred this time, and confirms whether or not both are within the same memory block. If no ECC error has occurred previously in the same memory block as the ECC error that has occurred this time (No in step S900), the analysis data storage unit 153 determines in step S903 that it is unknown whether the ECC error is a hard error.

If an ECC error has previously occurred in the same memory block as the ECC error that has occurred this time (YES in step S900), in step S901, the analysis data storage unit 153 compares the memory addresses to determine whether or not the ECC error that has occurred this time and the ECC error that has occurred before are memory cells on different bit lines. When the ECC error occurs in a memory cell on the same bit line (No in the S901 of steps), the possibility of a hard error related to the bit line is large. For this reason, the analysis data storage unit 153 determines that these ECC errors are hardware errors in step S904.

When an ECC error has occurred in a memory cell on a different bit line (Yes in step S901), in step S902, the analysis data storage unit 153 compares the memory addresses to determine whether or not the location of the ECC error that has occurred this time and the location of the ECC error that has occurred previously are memory cells on different word lines. When an ECC error occurs in a memory cell on the same word line (No in the S902 of steps), the possibility of a hard error related to the word line is large. For this reason, the analysis data storage unit 153 determines that these ECC errors are hardware errors in step S904. If no ECC error has occurred in the memory cell on the same word line (YES in step S902), the analysis data storage unit 153 determines in step S903 that it is unknown whether the ECC error is a hard error. When it is determined that the ECC error is a hardware error, the analysis data storage unit 153 adds information indicating that the ECC error is a hardware error to the analysis data. That is, information indicating a hard error is associated with the error information and the stress data.

Figure 23:
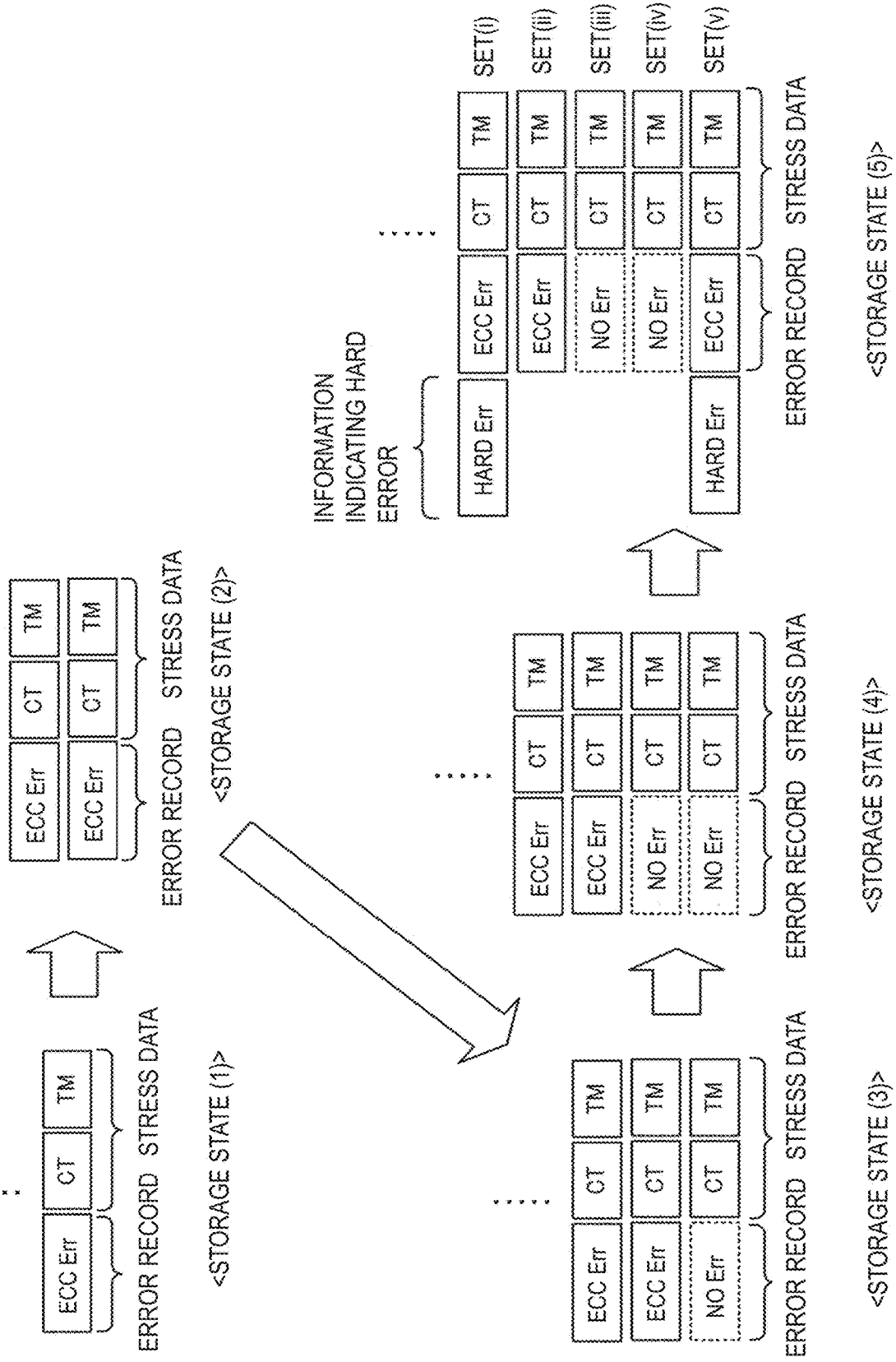
FIG. 23 is schematic diagram illustrating an example of a storing process of analysis data.

The above operation will be described in detail with reference to FIG. 23. FIG. 23 is a schematic diagram showing an example of a storing process of analysis data. In FIG. 23, a storage state (1) indicates a state in which an ECC error has occurred, and error recording information indicating the occurrence of the error and stress data are stored. These data sets will be referred to as sets (i). The storage state (2) indicates a state in which an ECC error occurs after the storage state (1), and error record information indicating the occurrence of the error and stress data are stored. These data sets will be referred to as sets (ii). The storage state (3) indicates a state in which a predetermined storage timing arrives after the storage state (2), and error recording information and stress data are stored. These data sets will be referred to as sets (iii). The storage state (4) indicates a state in which a predetermined storage timing arrives again after the storage state (3), and error recording information and stress data are stored. These data sets will be referred to as sets (iv). The storage state (5) indicates a state in which an ECC error occurs after the storage state (4), and error record information indicating the occurrence of the error and stress data are stored. These data sets will be referred to as sets (v).

In the example shown in FIG. 23, it is found that the ECC error indicated by the error recording information of the set (v) and the ECC error indicated by the error recording information of the set (i) occurred at the address on the same word line at the stage when the stress data of the set (v) was obtained. Therefore, when an ECC error indicated by the error record information of the set (v) occurs, information indicating that the ECC error is a hard error is associated with the set (i) and the set (v).

If the set (ii) is not judged as a hard error even after a sufficient time has elapsed (for example, 1 month), the analysis data storage unit 153 may judge the set (ii) as a soft error. In this instance, for example, if the soft error rate of a certain MCU 100 is significantly higher than that of another MCU 100, the analysis unit 210 may analyze whether there is any factor specific to the MCU 100 other than radiation from the relationship with the stress data. As a result, for example, an event such as a temporal decrease in the power supply voltage of the MCU 100 is easily caused is discovered.

The fifth embodiment has been described above. According to the present embodiment, the ECC error can be classified into one caused by a hard error and one caused by a soft error. Therefore, it is possible to prevent noise information such as a soft error caused by radiation or the like unrelated to stress from being mixed in the analysis data group for predicting the occurrence of an error or the like. Therefore, it is possible to perform various analyses such as identification of an error cause and error prediction with higher accuracy. Therefore, countermeasures for suppressing the recurrence of the memory error become easy.

Although the invention made by the inventor has been specifically described based on the embodiment, the present invention is not limited to the embodiment already described, and it is needless to say that various modifications can be made without departing from the gist thereof.

What is claimed is:

1. A semiconductor device, comprising:
   a module having a predetermined function;
   an error information acquisition circuit that acquires error information about an error occurred in the module;
   a stress acquisition circuit that acquires a stress cumulative value as a cumulative value of stress applied to the semiconductor device;
   an analysis data storage that stores analysis data as data for analyzing a state of the semiconductor device, the analysis data being data which associates the error information with the stress cumulative value at a time of occurrence of the error; and
   an operation time acquisition circuit that acquires a cumulative operation time which is a cumulative value of the operation time of the semiconductor device,
   wherein the analysis data storage stores error time data as the analysis data, and
   wherein the error time data is data which associates the error information with the stress cumulative value at the time when the error occurred and the cumulative operation time at the time when the error occurred.

2. The semiconductor device according to claim 1, wherein the analysis data storage further stores at a predetermined storage timing, as the analysis data, predetermined time data which is data associating the stress cumulative value at the predetermined storage timing with the cumulative operation time at the predetermined storage timing,
   wherein the analysis data includes at least the error time data and the predetermined time data immediately before the time at which the error corresponding to the error time data occurs.

3. The semiconductor device according to claim 2, further comprising an analyzer which analyzes a state of the semiconductor device by evaluating an increase amount of stress immediately before the time at which the error corresponding to the error time data occurs based on the error time data and the predetermined time data immediately before the time at which the error corresponding to the error time data occurs.

4. The semiconductor device according to claim 3, wherein the analyzer further analyzes a state of the semiconductor device by evaluating the stress cumulative value at the time at which the error corresponding to the error time data occurs or the stress cumulative value immediately before the time at which the error corresponding to the error time data occurs.

5. The semiconductor device according to claim 1, further comprising:
   a ring oscillator;
   a counter circuit that counts the number of oscillations of the ring oscillator in a predetermined period; and
   a p-th power calculation circuit that calculates a p-th power value which is a p-th power (p is a natural number) value of a count value of the counter circuit,
   wherein the stress cumulative value is an accumulated value of the p-th power value, and
   wherein the analysis data storage stores, as the analysis data, data which associates the error information with the stress cumulative value at the time when the error occurred, the cumulative operation time at the time when the error occurred, and the count value at the time when the error occurred or the p-th power value.

6. The semiconductor device according to claim 1, wherein, when an error occurred in the module is related to a data error of a memory, the analysis data storage stores, as the analysis data, data associating information indicating whether the error is a hardware error or not with the error information and the stress cumulative value at the time of occurrence of the error.

7. The semiconductor device of claim 1, wherein the error information includes information about an error that does not lead to a failure of the semiconductor device due to a functional safety mechanism.

8. An analysis system, comprising:

a semiconductor device; and a server, wherein the semiconductor device includes a module having a predetermined function, an error information acquisition circuit that acquires error information about an error occurred in the module, a stress acquisition circuit that acquires a stress cumulative value as a cumulative value of stress applied to the semiconductor device, and an analysis data storage that stores analysis data which is data associating the error information with the stress cumulative value at a time of occurrence of the error, and wherein the server analyzes a state of the semiconductor device based on the analysis data, wherein the semiconductor device further comprises an operation time acquisition circuit that acquires a cumulative operation time which is a cumulative value of a time at which the semiconductor device operates, wherein the analysis data storage stores, at a predetermined storage timing, predetermined time data which is data associating the stress cumulative value at a time of the storage timing with the cumulative operation time at the time of the storage timing, as the analysis data, and when an error occurs, stores error time data which is data associating the error information and the stress cumulative value with the cumulative operation time at the time of occurrence of the error, as the analysis data, and wherein the server analyzes a state of the semiconductor device based on the error time data and the predetermined time data immediately before the time at which the error corresponding to the error time data occurs, by evaluating an increase amount of stress immediately before the time at which the error corresponding to the error time data occurs.

9. The analysis system according to claim 8, wherein the semiconductor device further includes an operation time acquisition circuit that acquires an accumulated operation time which is an accumulated value of a time at which the semiconductor device operates, wherein the analysis data storage stores, when an error occurs, error time data which is data associating the error information with the stress cumulative value at the time when the error occurs and the accumulated operation time at the time when the error occurs as the analysis data, and wherein the server generates a model by machine learning using training data including the error time data.

10. The analysis system according to claim 9, wherein the analysis data storage stores, at a predetermined storage timing, predetermined time data which is data associating the stress cumulative value at the time of the storage timing with the accumulated operation time at the time of the storage timing, as the analysis data, and, when an error occurs, stores, as the analysis data, error time data, which is data associating the error information with the stress cumulative value at the time when the error occurs and the accumulated operation time at the time when the error occurs, wherein the server generates a model by machine learning using an aggregation data of the analysis data as training data, and wherein the aggregation data includes the error time data and n sets (n is an integer of 1 or more) of the analysis data at the time of the occurrence of the error corresponding to the error time data.

* * * * *